(12) United States Patent
Katagiri et al.

(10) Patent No.: US 7,689,944 B2
(45) Date of Patent: Mar. 30, 2010

(54) METHOD FOR DESIGNING SEMICONDUCTOR APPARATUS, SYSTEM FOR AIDING TO DESIGN SEMICONDUCTOR APPARATUS, COMPUTER PROGRAM PRODUCT THEREFOR AND SEMICONDUCTOR PACKAGE

(75) Inventors: Mitsuaki Katagiri, Tokyo (JP); Satoshi Nakamura, Yokohama (JP); Takashi Suga, Yokohama (JP); Satoshi Isa, Tokyo (JP); Yoji Nishio, Tokyo (JP); Seiji Funaba, Tokyo (JP); Yukitoshi Hirose, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 749 days.

(21) Appl. No.: 11/511,438

(22) Filed: Aug. 29, 2006

(65) Prior Publication Data

US 2007/0057380 A1 Mar. 15, 2007

(30) Foreign Application Priority Data

Aug. 29, 2005 (JP) ............................. 2005-247935

(51) Int. Cl.
*G06F 17/50* (2006.01)
(52) U.S. Cl. ......................................................... 716/4
(58) Field of Classification Search .................. 716/2, 716/4–5, 13–14; 703/13–14
See application file for complete search history.

(56) References Cited

U.S. PATENT DOCUMENTS 6,385,565 B1* 5/2002 Anderson et al. ............. 703/18
6,604,065 B1* 8/2003 Blomgren et al. ............. 703/15
6,643,839 B1* 11/2003 Nishio et al. .................. 716/15
6,810,340 B2* 10/2004 Shimazaki et al. ............ 702/65
7,010,768 B2* 3/2006 Dahlen et al. .................. 716/6
7,278,124 B2* 10/2007 Shimazaki et al. ............. 716/5
2004/0261045 A1* 12/2004 Dahlen et al. .................. 716/6
2005/0149894 A1* 7/2005 Shimazaki et al. ............. 716/5
2007/0204251 A1* 8/2007 Katagiri et al. ............... 716/10

FOREIGN PATENT DOCUMENTS

JP 2002-032424 1/2002
JP 2004-054522 2/2004
JP 2005-196406 7/2005

OTHER PUBLICATIONS

Japanese Notice of Reasons for Rejection, w/ English translation thereof, issued in Japanese Patent Application No. JP 2005-247935 dated Jun. 23, 2009.

* cited by examiner

*Primary Examiner*—Stacy A Whitmore
(74) *Attorney, Agent, or Firm*—McDermott Will & Emery LLP

(57) ABSTRACT

A method for designing a semiconductor apparatus comprising a semiconductor package in consideration of power integrity for a semiconductor chip included in the semiconductor package is disclosed. A target variable for an adjustment target is calculated on the basis of target information about the adjustment target, wherein the target variable is represented in frequency domain, and the adjustment target includes a part of the semiconductor package. The target variable is compared with a predetermined constraint, which is represented in frequency domain, to identify a problematic section, wherein the problematic section corresponds to a frequency region at which the target variable exceeds the predetermined constraint. Design guidelines are decided to solve the identified problematic section.

65 Claims, 19 Drawing Sheets

US 7,689,944 B2

METHOD FOR DESIGNING SEMICONDUCTOR APPARATUS, SYSTEM FOR AIDING TO DESIGN SEMICONDUCTOR APPARATUS, COMPUTER PROGRAM PRODUCT THEREFOR AND SEMICONDUCTOR PACKAGE

BACKGROUND OF THE INVENTION

This invention relates to a designing method aiming power integrity of a semiconductor chip included in the semiconductor package and to a design aid system and a computer program product in both of which the method is implemented. The invention also relates to a semiconductor package manufactured in accordance with the method.

In a semiconductor chip such as a dynamic random access memory (DRAM) chip, transient currents flow at a power supply pad and a ground pad of the semiconductor chip, for example, when an output driver of the semiconductor chip changes its output state, i.e. from high level to low level, or from low level to high level. The transient currents cause voltage fluctuations at the power supply pad and the ground pad.

If the above-mentioned voltage fluctuations exceed a certain level, the semiconductor chip fails to function properly. Therefore, each semiconductor package including the semiconductor chip should be designed in consideration of a suitable voltage fluctuation limitation. Namely, each semiconductor package should be designed so that the voltage fluctuations at the power supply pad and at the ground pad of the semiconductor chip do not exceed the voltage fluctuation limitation.

Regarding the above, one of conventional approaches is based on a transient analysis using a SPICE (Simulation Program with Integrated Circuit Emphasis) model. Such a transient analysis is disclosed in JP-A 2004-54522. According to the conventional transient analysis, a user can judge whether a designed semiconductor package violates the voltage fluctuation limitation therefor.

However, according to the conventional transient analysis, nobody can identify a problematic section of each semiconductor package. Therefore, even if a violation is found as a result of the transient analysis, a design of the semiconductor package is modified without information about the problematic section. Hence, such design modification is normally carried out multiple times by trial and error, in accordance with the conventional transient analysis, so that its design cycle needs long time. The same goes for a semiconductor apparatus including a semiconductor package as mentioned above.

SUMMARY OF THE INVENTION

It is an object of the present invention to provide a novel design method which can shorten a design cycle of a semiconductor package or a semiconductor apparatus.

One aspect of the present invention provides a method for designing a semiconductor apparatus with a semiconductor package in consideration of power integrity for a semiconductor chip included in the semiconductor package. The semiconductor chip comprises a power supply pad and a ground pad. The semiconductor package comprises, in addition to the semiconductor chip, a power supply terminal, a ground terminal and electrical paths electrically connecting between the power supply pad and the power supply terminal and between the ground pad and the ground terminal, respectively. The method according to one aspect of the present invention comprises: calculating a target variable for an adjustment target on the basis of target information about the adjustment target, the target variable being represented in frequency domain, the adjustment target comprising at least the electrical paths; comparing the target variable with a predetermined constraint represented in frequency domain to identify a problematic section corresponding to a frequency region at which the target variable exceeds the predetermined constraint; and deciding design guidelines to solve the identified problematic section.

An appreciation of the objectives of the present invention and a more complete understanding of its structure may be had by studying the following description of the preferred embodiment and by referring to the accompanying drawings.

Figure 1:
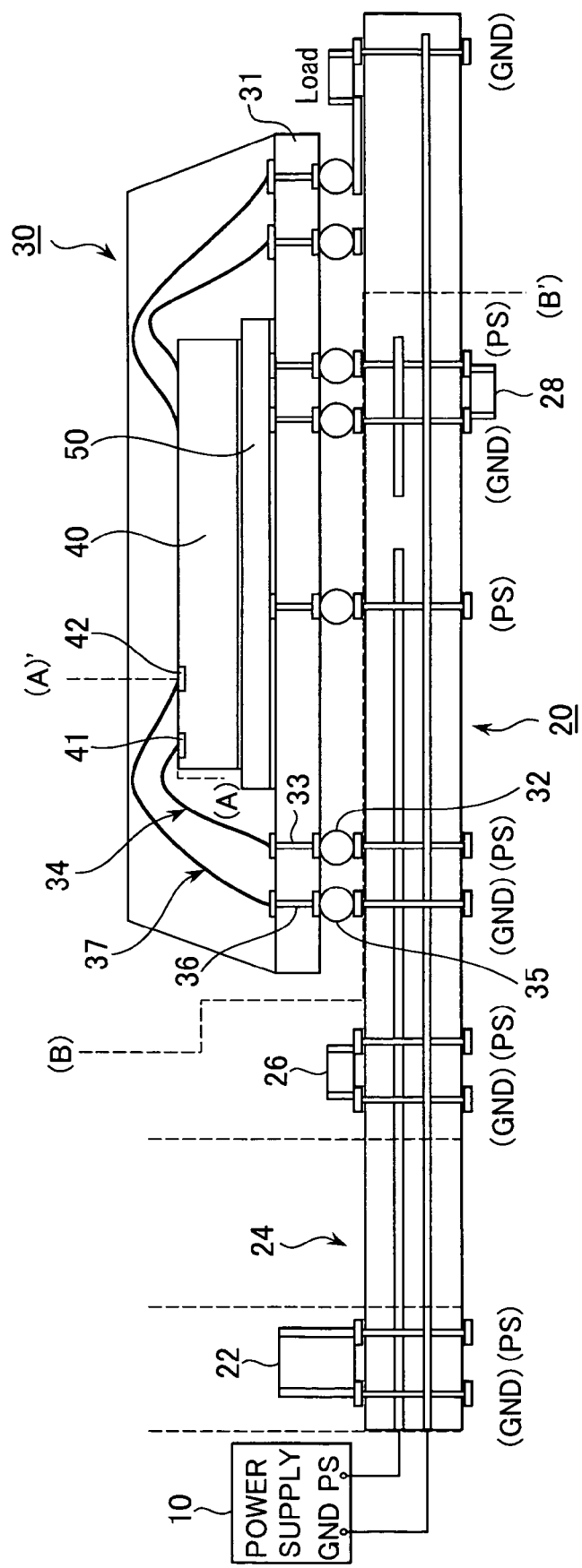
FIG. 1 is a view showing a semiconductor apparatus which is an adjustment target on design in accordance with a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Explanation will be made about a case where a design method according to a first embodiment of the present invention is applied for designing a semiconductor apparatus shown in FIG. 1.

With reference to FIG. 1, the semiconductor apparatus comprises a power supply unit 10, a printed circuit board (PCB) 20 and a multi-chip package (MCP) 30. The power supply unit 10 has a power supply portion (PS) and a ground portion (GND). The printed circuit board 20 comprises, as electrical components, a large capacitor 22, a power supply line 24, a bypass capacitor 26, and another bypass capacitor 28. The power supply line 24 is also referred to as a power supply pattern, a set of power supply traces, or a power supply plane. The bypass capacitor 26 is mounted on one surface of the printed circuit board 20, while the other bypass capacitor 28 is mounted the other surface of the printed circuit board 20. The multi-chip package 30 has a structure in which a DRAM chip 40 and a controller chip 50 are stacked on a package substrate 31. The DRAM chip 40 comprises a power supply pad 41 and a ground pad 42. The power supply pad 41 is connected to a power supply terminal (ball) 32 through a through-hole 33, a power supply line (wire) 34, traces (not shown) and so on. The ground pad 42 is connected to a ground terminal (ball) 35 through a through-hole 36, a ground line (wire) 37, traces (not shown) and so on. The power supply terminal 32 is electrically connected to the power supply portion of the power supply unit 10. The ground terminal 35 is electrically connected to the ground portion of the power supply unit 10. In this embodiment, the through-hole 33, the power supply line 34, traces and so on constitute an electrical path electrically connecting between the power supply pad 41 and the power supply terminal 32, while the through-hole 36, the ground line 37, traces and so on constitute another electrical path electrically connecting between the ground pad 42 and the ground terminal 35, respectively.

The method of the present embodiment is for providing design guidelines to suppress voltage fluctuation at the power supply pad 41 and/or the ground pad 42. The contents of the design guidelines are, for example, a problematic section as such included in the semiconductor apparatus and the solution thereof. The problematic section exists between the power supply unit 10 and the boundary (A)-(A)'. In other words, the problematic section is one or more of the electrical components and/or the at least one of the electrical paths. In this embodiment, the electrical components of the printed circuit board 20 and the electrical paths of the multi-chip package 30 constitute an adjustment target. The present invention is however not limited thereto, but only the electrical paths may constitute an adjustment target for the purpose of multi-chip package.

Figure 2:
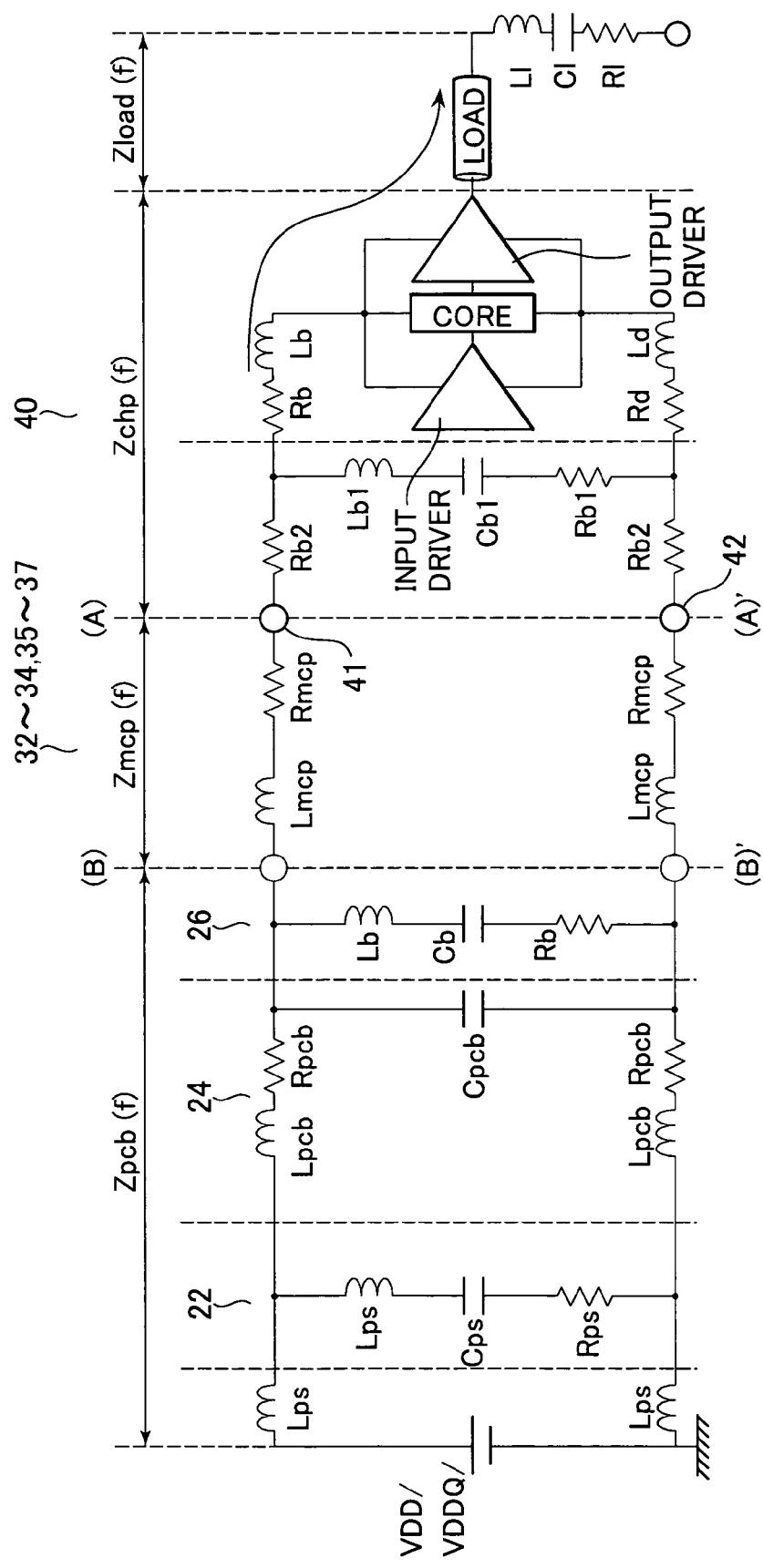
FIG. 2 is a view showing an equivalent circuit model to the semiconductor apparatus of FIG. 1.

The semiconductor apparatus of FIG. 1 can be represented as an equivalent circuit model, e.g. a model shown in FIG. 2. As apparent from FIGS. 1 and 2, every electrical element constituting the adjustment target can be represented as an R/L/C element. Therefore, each section between the power supply unit 10 and the boundary (A)-(A)' can be represented as a passive circuit block so that the impedance of each section can be represented as a function of frequency, i.e. each section has a frequency-dependent impedance.

In FIG. 2, there are four impedances $Zpcb(f)$, $Zmcp(f)$, $Zchp(f)$ and $Zload(f)$. The impedance $Zpcb(f)$ is an impedance of the printed circuit board 20. The impedance $Zmcp(f)$ is generally an impedance of the multi-chip package but except for the DRAM chip 40. In this embodiment, the impedance $Zmcp(f)$ is a total impedance of the electrical paths between the power supply pad 41/the ground pad 42 and the power supply terminal 32/the ground terminal 35. The impedance $Zchp(f)$ is an impedance between the power supply pad 41 and the ground pad 42 of the DRAM chip 40. The impedance $Zload(f)$ is an impedance of a load connected to a DQ output driver of the DRAM chip 40.

One of major factors of voltage fluctuation on the power supply pad 41 and/or the ground pad 42 is transient currents upon the change of the output state at the DQ output driver included in the DRAM chip 40. The degrees of the voltage fluctuations are dependent not only on the transient currents but also on the magnitudes of the impedances $Zpcb(f)$, $Zmcp(f)$ and $Zchp(f)$.

If the impedances $Zpcb(f)$, $Zmcp(f)$ and $Zchp(f)$ are fixed, the maximum voltage fluctuation occurs upon the maximum transient current flowing. Therefore, in order to suppress the maximum voltage fluctuation below a suitable voltage fluctuation limitation, it is required that the impedance $Zpcb(f)$ and/or the impedance $Zmcp(f)$ are adjusted in consideration of the state of the maximum transient current flowing, wherein the maximum transient current in the DRAM chip 40 can be seen for example when all of the output drivers are driven simultaneously or when a refresh operation is carried out in a core circuit of the DRAM chip 40.

Figure 3:
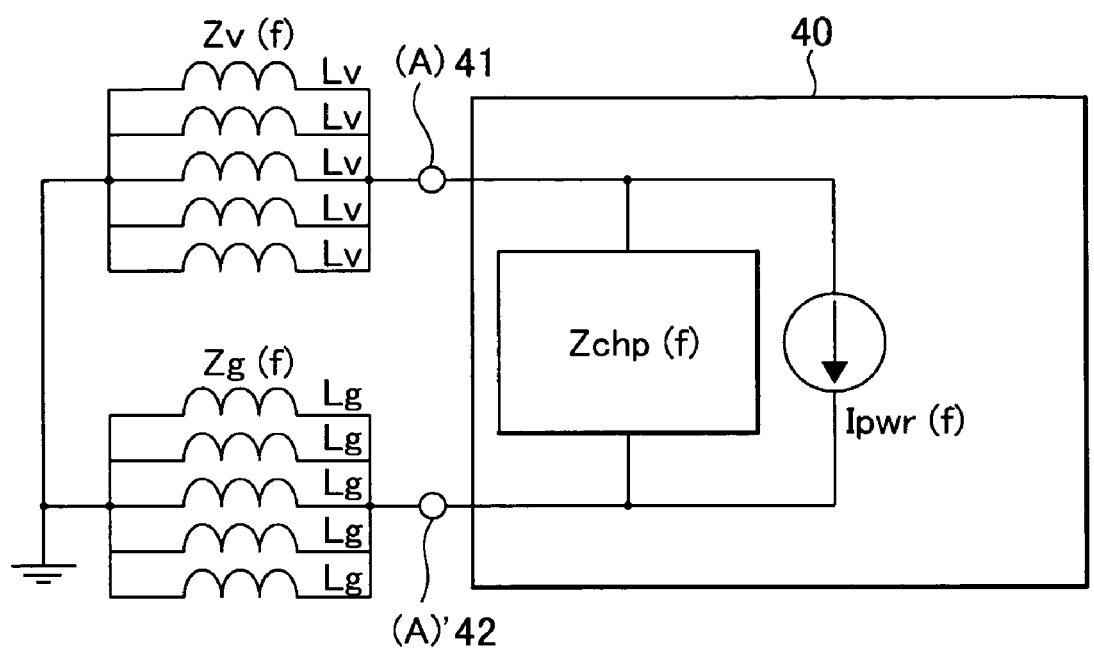
FIG. 3 is a view showing a chip model that includes a current source.
Figure 4:
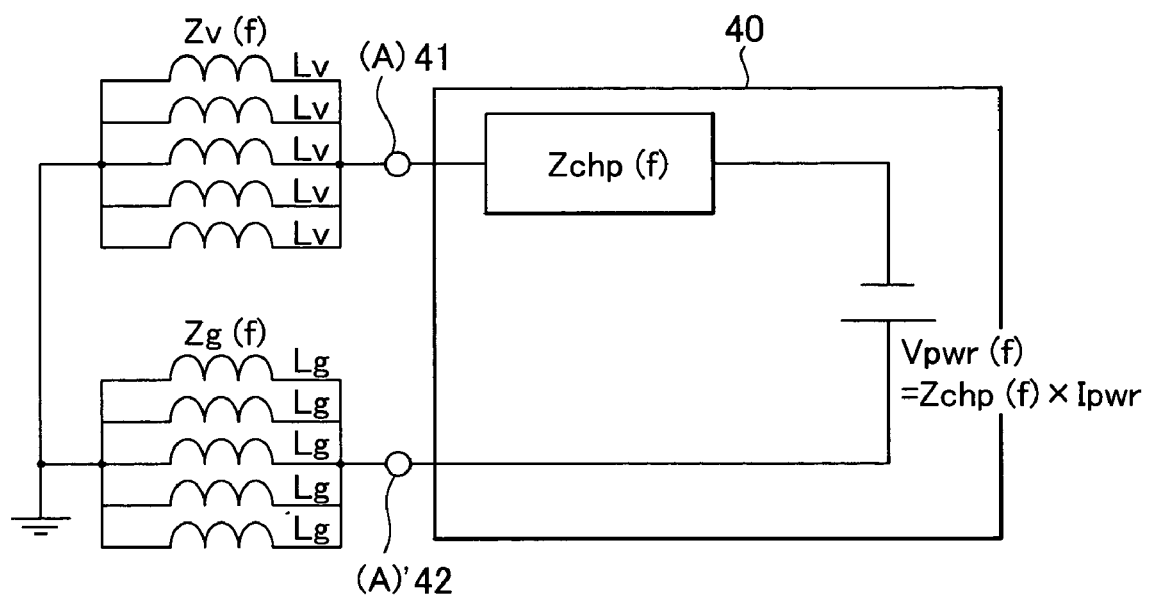
FIG. 4 is a view showing another chip model that includes a voltage source.

With reference to FIG. 3, a model of the DRAM chip 40 is created with a current source which provides a frequency-dependent current $Ipwr(f)$ same as the maximum transient current. The model of the DRAM chip 40 is referred to as a chip model in this embodiment. As apparent from FIG. 3, the chip model is an equivalent circuit model represented in frequency domain, as seen from the power supply pad 41 and the ground pad 42 towards the inside of the DRAM chip 40. The chip model of FIG. 3 has a structure where the impedance $Zchp(f)$ and the current source $Ipwr(f)$ are connected in parallel with each other between the power supply pad 41 and the ground pad 42. In FIG. 3, the impedance $Zv(f)$ is a power-supply-related impedance on the adjustment target, while the impedance $Zg(f)$ is a ground-related impedance on the same. In other words, the impedance $Zv(f)$ is a combined impedance of power-supply-related parts of the impedances $Zpcb(f)$ and $Zmcp(f)$, while the impedance $Zg(f)$ is a combined impedance of ground-related parts of the impedances $Zpcb(f)$ and $Zmcp(f)$. With reference to FIG. 4, another chip model of the DRAM chip 40 is equivalent to that of FIG. 3 and has a structure where a voltage source and the impedance $Zchp(f)$ are connected in series between the power supply pad 41 and the ground pad 42, wherein the voltage source provides a frequency-dependent voltage $Vpwr(f)$ which is equal to a product of the impedance $Zchp(f)$ and the frequency-dependent current $Ipwr(f)$; namely, the frequency-dependent voltage $Vpwr(f)$ is equal to a result of multiplying the impedance $Zchp(f)$ by the frequency-dependent current $Ipwr(f)$. The chip model of FIG. 4 may be used instead of the chip model of FIG. 3.

The chip model can be created for example by: calculating the impedance $Zchp(f)$ and the current $Ipwr(f)$ or the voltage $Vpwr(f)$ from design data of the DRAM chip 40; obtaining the impedance $Zchp(f)$ and the current $Ipwr(f)$ or the voltage $Vpwr(f)$ on the basis of a SPICE model based simulation; or actually measuring the impedance $Zchp(f)$ and the current $Ipwr(f)$ or the voltage $Vpwr(f)$ of the DRAM chip 40. Note here that the thus created chip model can be used repeatedly for the same kind of the DRAM chip without any modification.

Figure 5:
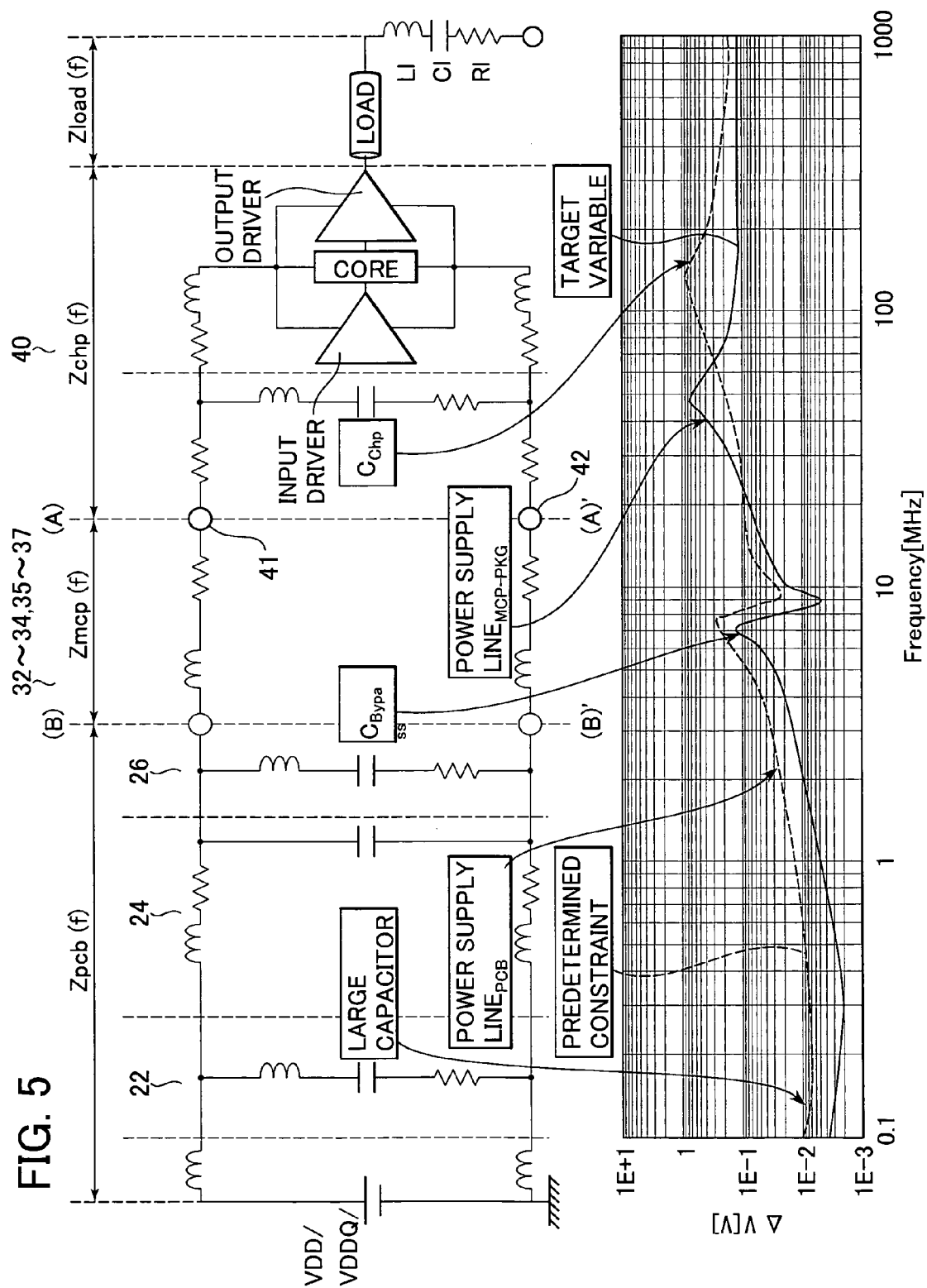
FIG. 5 is a view for use in describing some features included in a design method in accordance with the first embodiment.

By connecting the thus created chip model (Zchp(f) and Ipwr(f)) with the adjustment target (Zpcb(f) and Zmcp(f), the voltage fluctuation spectrums at the power supply pad 41 and the ground pad 42 can be calculated. With reference to the lower part of FIG. 5, the thus calculated voltage fluctuation spectrum ΔV(f) at the power supply pad 41 is illustrated as a target variable, while the voltage fluctuation spectrum ΔG(f) at the ground pad 42 is not shown in the figure.

The target variable is compared with a predetermined constraint in frequency domain. The predetermined constraint is prepared by, for example, calculation from the design data of the already-validated semiconductor apparatus (or package). The predetermined constraint may be prepared by actual measurement of the already-validated semiconductor apparatus (or package). The predetermined constraint may be selected and determined to be a value equal to or less than 10% of the power supply level of the power supply unit 10.

As described above, each section of the adjustment target has a frequency-dependent impedance. The impedance is normally unique to the section because of the RLC components of the section. Therefore, the comparison in frequency domain allows to readily identify a problematic section, which corresponds to a frequency region at which the target variable exceeds the predetermined constraint. For example, in the embodiment shown in FIG. 5, the target variable exceed the predetermined constraint at a frequency region of about 30 MHz to about 60 MHz. The frequency region corresponds to the power-supply-related electrical path, i.e. the through-hole 33, the power supply line 34, traces and so on, which are correctively shown as a power supply line of the multi-chip package 30 in FIG. 5. The power-supply-related electrical path is the problematic section of the semiconductor apparatus, and the problem can be solved by the design modification of the power-supply-related electrical path, for example, the modification of length/width/thickness of the traces included in the power-supply-related electrical path.

The method of the present embodiment is based on the above approach and will be hereinafter explained in detail with reference to FIGS. 6 and 7.

Figure 6:
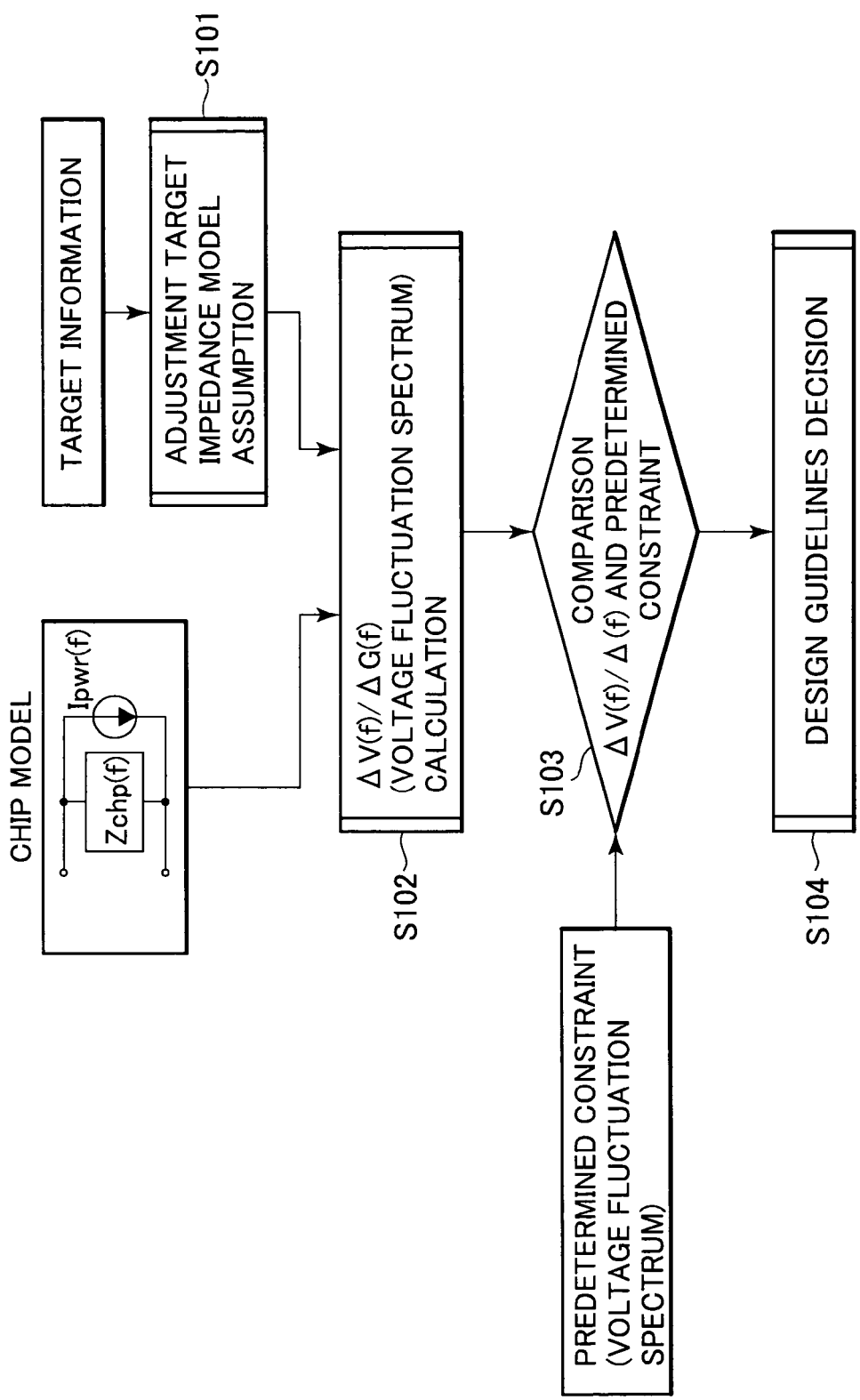
FIG. 6 is a flowchart showing the design method of the first embodiment.

As shown in FIG. 6, an assumed impedance model of the adjustment target is created from target information such as design data of the DRAM chip 40 (Step S101). The assumed impedance model is a simple version of the model of FIG. 2 and comprises, for example, the power-supply-related impedance Zv(f) and the ground-related impedance Zg(f), as shown in left part of FIG. 7.

Figure 7:
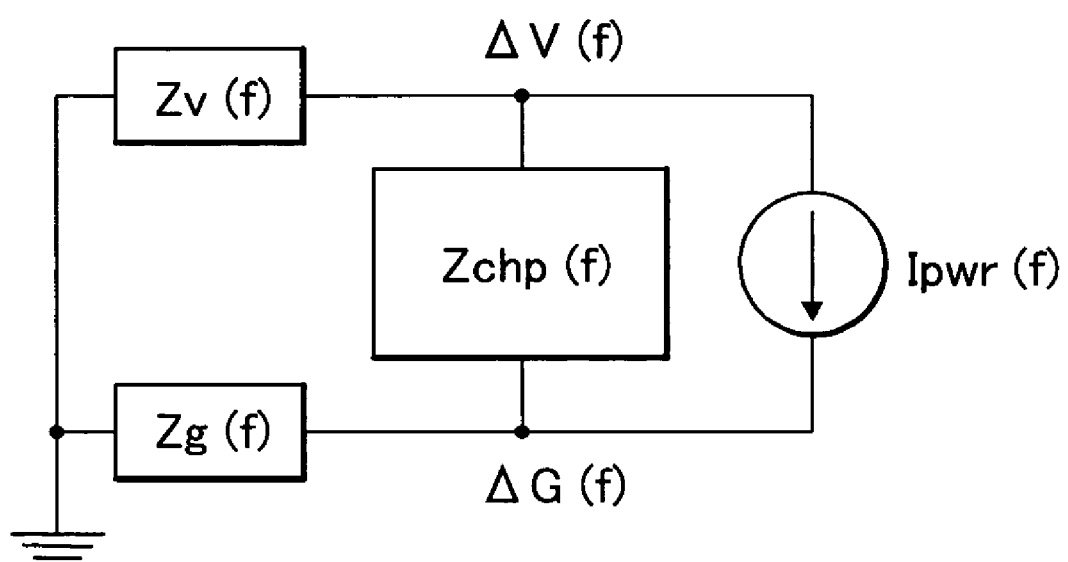
FIG. 7 is a view for use in describing a voltage fluctuation spectrum calculation process shown in FIG. 6.

Next, the assumed impedance model is connected to the chip model to obtain a total model of the semiconductor apparatus as shown in FIG. 7; based on the model of FIG. 7, voltage fluctuation spectrums are calculated as the target variables (Step S102). For example, the voltage fluctuation spectrum ΔV(f) at the power supply pad 41 and the voltage fluctuation spectrum ΔG(f) at the ground pad 42 can be represented as following equations:

$$\Delta V(f) = \frac{Z_{chp} \times Z_v}{Z_v + Z_g + Z_{chp}} \times I_{pwr}(f) \quad (1)$$

$$\Delta G(f) = \frac{Z_{chp} \times Z_g}{Z_v + Z_g + Z_{chp}} \times I_{pwr}(f) \quad (2)$$

If the ground-related components of the semiconductor apparatus are stabilized strongly so that its voltage fluctuation spectrum ΔG(f) can be regarded as zero, it is enough to take only the equation (1) into consideration.

Turning back to FIG. 6, the target variables ΔV(f) and ΔG(f) are compared with a predetermined constraint in frequency domain (Step S103), wherein the predetermined constraint is also a voltage fluctuation spectrum in this embodiment. If there is included a problematic section in the semiconductor apparatus, the problematic section is identified as the result of the comparison.

After the identification of the problematic section, design guidelines are decided to solve the identified problematic section (Step S104). The design guidelines are, for example, the optimized impedance of at least one of the electrical paths, the optimized width, length and/or thickness of at least one trace of a pattern or a wire included in at least one of the electrical paths, a result of pass/fail (validity/invalidity of design) determination for at least one trace of a pattern or at least one wire included in at least one of the electrical paths, the optimized electrical length of at least one of the electrical paths, the optimized number of layers constituting the package substrate 31, the minimized width of at least one trace of a pattern included in at least one of the electrical paths if the target information relates to a length of the trace, and the maximized length of at least one trace of a pattern included in at least one of the electrical paths if the target information relates to a width of the trace. The design guidelines may include information about the identified problematic section as such, for example, the position thereof.

The adjustment target according to the above-explained embodiment includes the electrical components of the printed circuit board 20. However, the present invention is not limited thereto. The impedance Zpcb(f) may be regarded as zero or a fixed value so that only the electrical paths are substantially regarded as the adjustment target. In this view, "semiconductor apparatus" may be not only "apparatus including semiconductor package" but also "semiconductor package as such". In addition, the above-described embodiment relates to the multi-chip package 30, but "semiconductor package" may be "single chip package".

Figure 8:
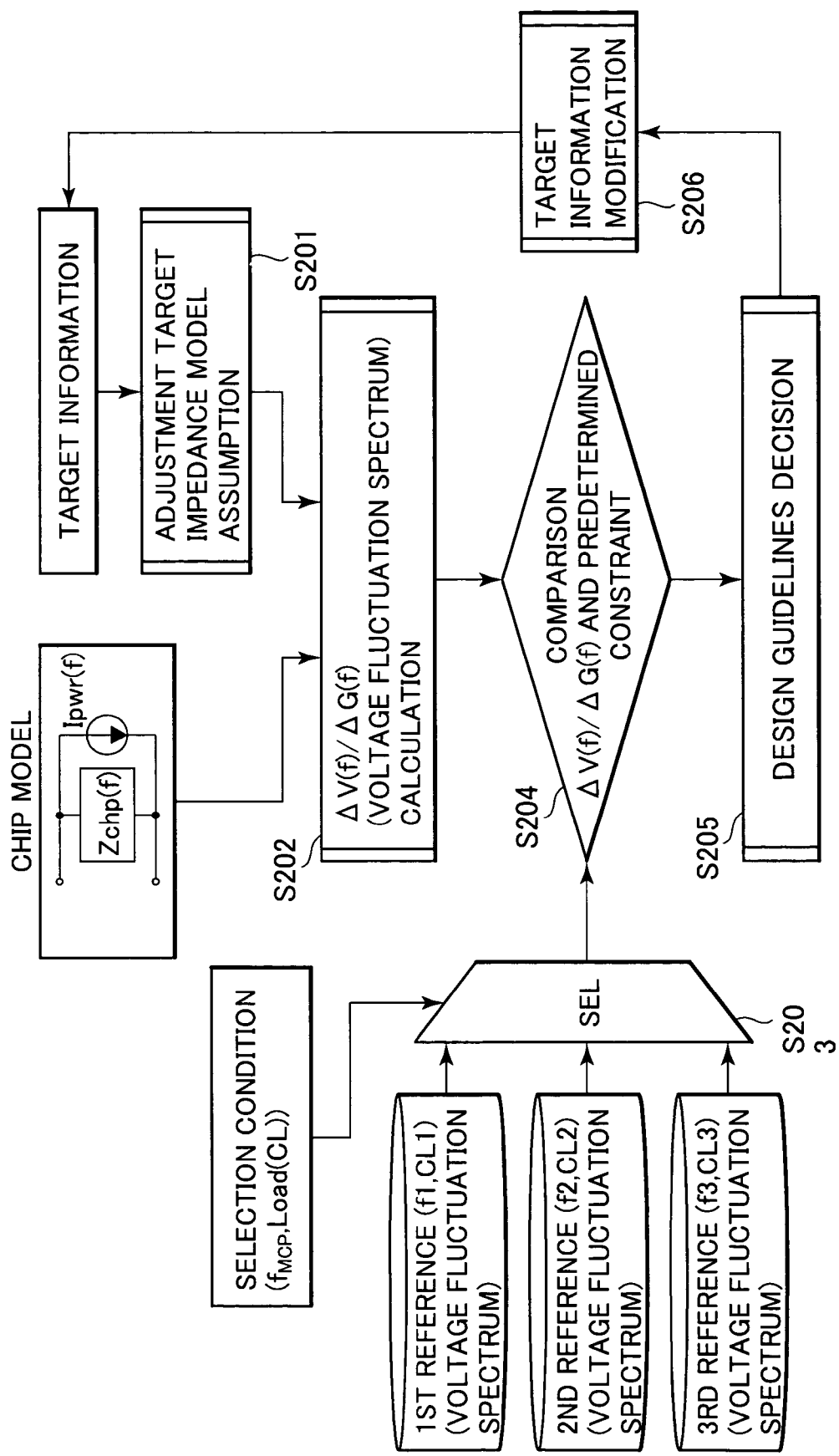
FIG. 8 is a flowchart showing a design method in accordance with a second embodiment of the present invention.

Next explanation will be made about a design method according to a second embodiment of the present invention, with reference to FIG. 8. As comparison FIGS. 6 and 8, the design method of the second embodiment is a modification of the design method of the first embodiment. The second embodiment is different from the first embodiment in that Steps S203 and S206 of FIG. 8 are not included in FIG. 1. Steps S201, S202, S204 and S205 of FIG. 8 are same as Steps S101, S102, S103 and S104 of FIG. 6. Hereinafter, only the difference will be described.

In this embodiment, a plurality of references are prepared in advance, and one of the prepared references is selected as a predetermined constraint (Step S203). In detail, first to third references are prepared in this embodiment. The first to the third references are prepared by, for example, calculation from the design data of the already-validated semiconductor apparatus (or package) in consideration of various conditions, for example, frequency or magnitude of load. The first to the third references may be prepared by actual measurement of the already-validated semiconductor apparatus (or package) under multiple conditions. Each of the first to the third references may be selected and determined to be a value equal to or less than 10% of the power supply level of the power supply unit 10. One of the first to the third references is selected on the basis of a selection condition(s) such as an operational frequency of the multi-chip package 30 or its load (normally, capacitance); the selected reference is used as the predetermined constraint in the comparison process of Step S204. As the result of Step S204, design guidelines are decided in Step S205.

In Step S206, the target information is modified in consideration of the decided design guidelines; the modified target information is used in Step S201 so that it is verified whether there is a problematic section. The step is useful for the case where the method of the present invention is implemented as a design aid system, i.e. for an automated processing.

Figure 9:
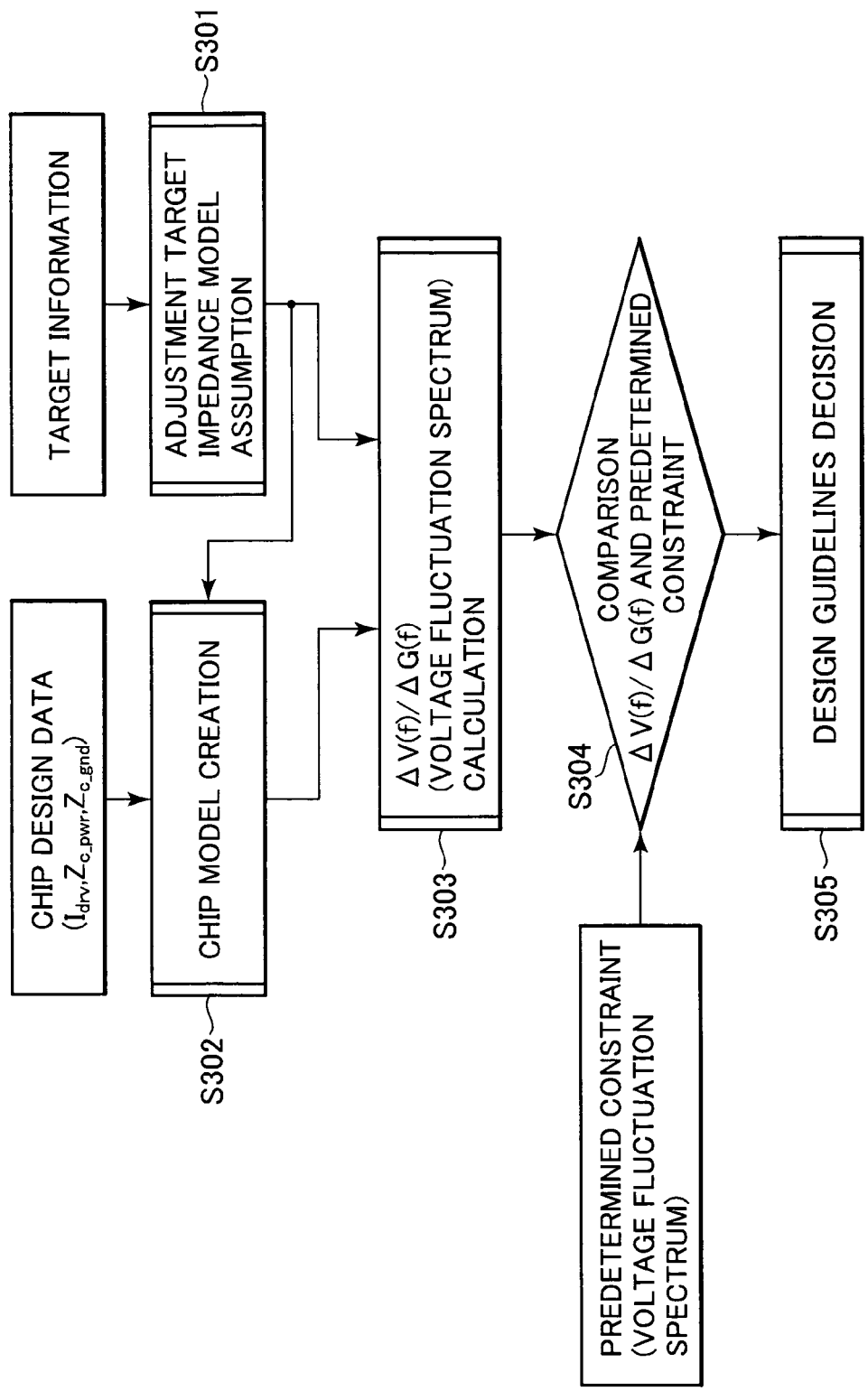
FIG. 9 is a flowchart showing a design method in accordance with a third embodiment of the present invention.

Next explanation will be made about a design method according to a third embodiment of the present invention, with reference to FIG. 9. The design method of the third embodiment is a modification of the design method of the first embodiment. The third embodiment is different from the first embodiment in that, as shown in Step S302 of FIG. 9, the chip model is created in the field where the method is actually carried out. Namely, the chip model of the third embodiment is neither a pre-created chip model based on design data nor the already-created chip model based on design data nor a pre-created chip model based on an actual measurement of the DRAM chip 40. Steps S301, S303 to S305 of FIG. 9 are generally same as Steps S101 to S104 of FIG. 6. Hereinafter, only the difference will be described.

In Step S302, the chip model is created from design data of the DRAM chip 40 and the assumed impedance model of the adjustment target. Note here that it is useful to assume that the impedance Zpcb(f) is equal to zero, because the total amount of calculation can be decreased drastically.

Figure 10:
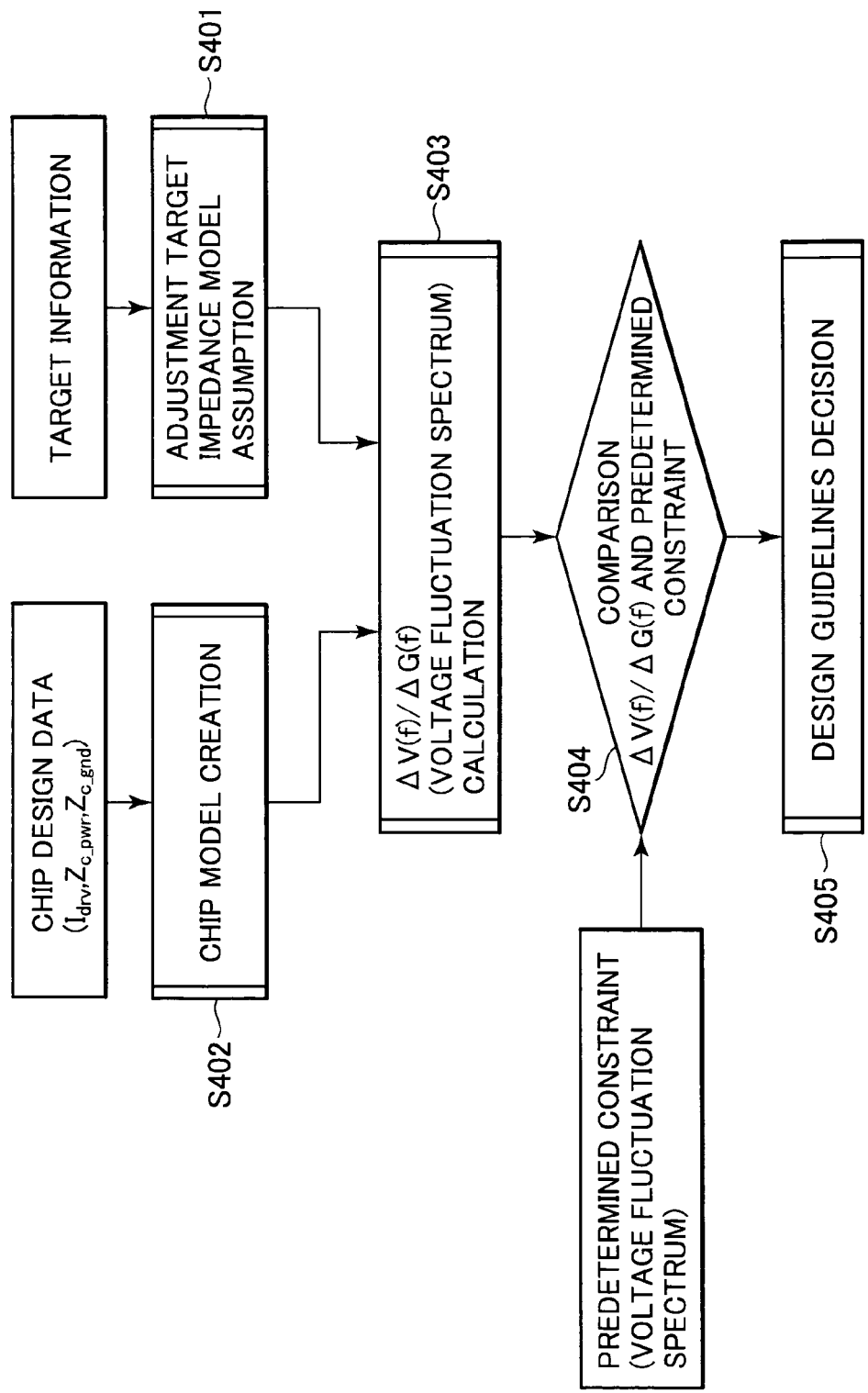
FIG. 10 is a flowchart showing a design method in accordance with a fourth embodiment of the present invention.

With reference to FIG. 10, a method according to a fourth embodiment of the present invention is a simplified version of the method of the third embodiment. Steps S401, S403 to S405 of FIG. 10 are same as S301, S303 to S305 of FIG. 9.

Step S402 is a chip model creation process similar to that of Step 302. The chip model is created on the basis of only the design data of the DRAM chip 40. Neither the target information nor the assumed impedance model of the adjustment target is used for creating a chip model. The creation process of Step S402 can decrease the total amount of calculation, although the accuracy of the calculation is degraded.

Figure 11:
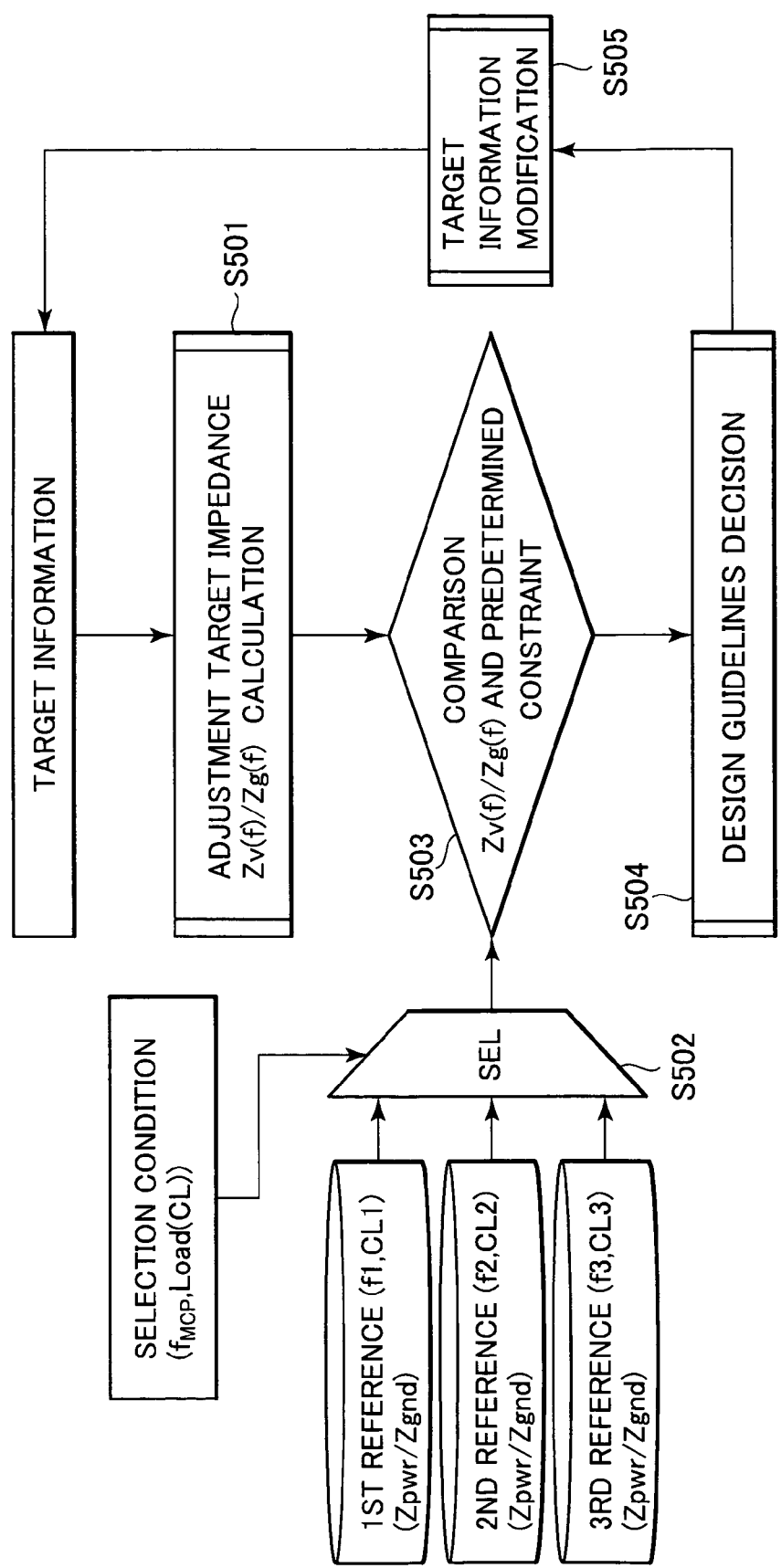
FIG. 11 is a flowchart showing a design method in accordance with a fifth embodiment of the present invention.

Next explanation will be made about a design method according to a fifth embodiment of the present invention, with reference to FIG. 11. The design method of the fifth embodiment is a modification of the design method of the second embodiment. Steps S501, S504 and S505 of FIG. 11 are same as Steps S201, S205 and S206 of FIG. 8. Steps S502 and S503 of FIG. 11 are similar to Steps S203 and S204 of FIG. 8. Hereinafter, only the difference will be described.

As apparent from the foregoing equations (1) and (2), if the frequency-dependent current Ipwr(f) and the impedance Zchp(f) are known, the power-supply-related impedance Zv(f) and the ground-related impedance Zg(f) are represented as functions of voltage fluctuation spectrums $\Delta V(f)$ and $\Delta G(f)$.

On the other hand, if there is known an already-validated semiconductor apparatus (package), the frequency-dependent current Ipwr(f) and the impedance Zchp(f) of the DRAM chip 40 included in the already-validated semiconductor apparatus (package) can be specified, and its voltage fluctuation spectrums $\Delta V(f)$ and $\Delta G(f)$ are suitable because it was already validated.

Therefore, a predetermined constraint may be an impedance represented in frequency domain on the basis of the already-validated semiconductor apparatus. In detail, the predetermined constraint may be an impedance of a model electrical path which is included in an already-validated semiconductor apparatus and corresponds to the at least one electrical path. In the above modeling, the current source of the chip model was already considered. Therefore, the power-supply-related impedance Zv(f) and the ground-related impedance Zg(f) can be used as the target variables so that the voltage fluctuation spectrums $\Delta V(f)$ and $\Delta G(f)$ calculation process of Step S202 can be omitted in this embodiment. Therefore, according to the present embodiment, the total amount of calculation can be more drastically decreased.

In Step S502 of this embodiment, one of the first to the third references (impedances) is selected on the basis of a selection condition(s) such as an operational frequency of the multi-chip package 30 or its load (normally, capacitance); the selected impedance(s) is used as the predetermined constraint in the comparison process of Step S503. As the result of Step S503, design guidelines are decided in Step S504.

Figure 12:
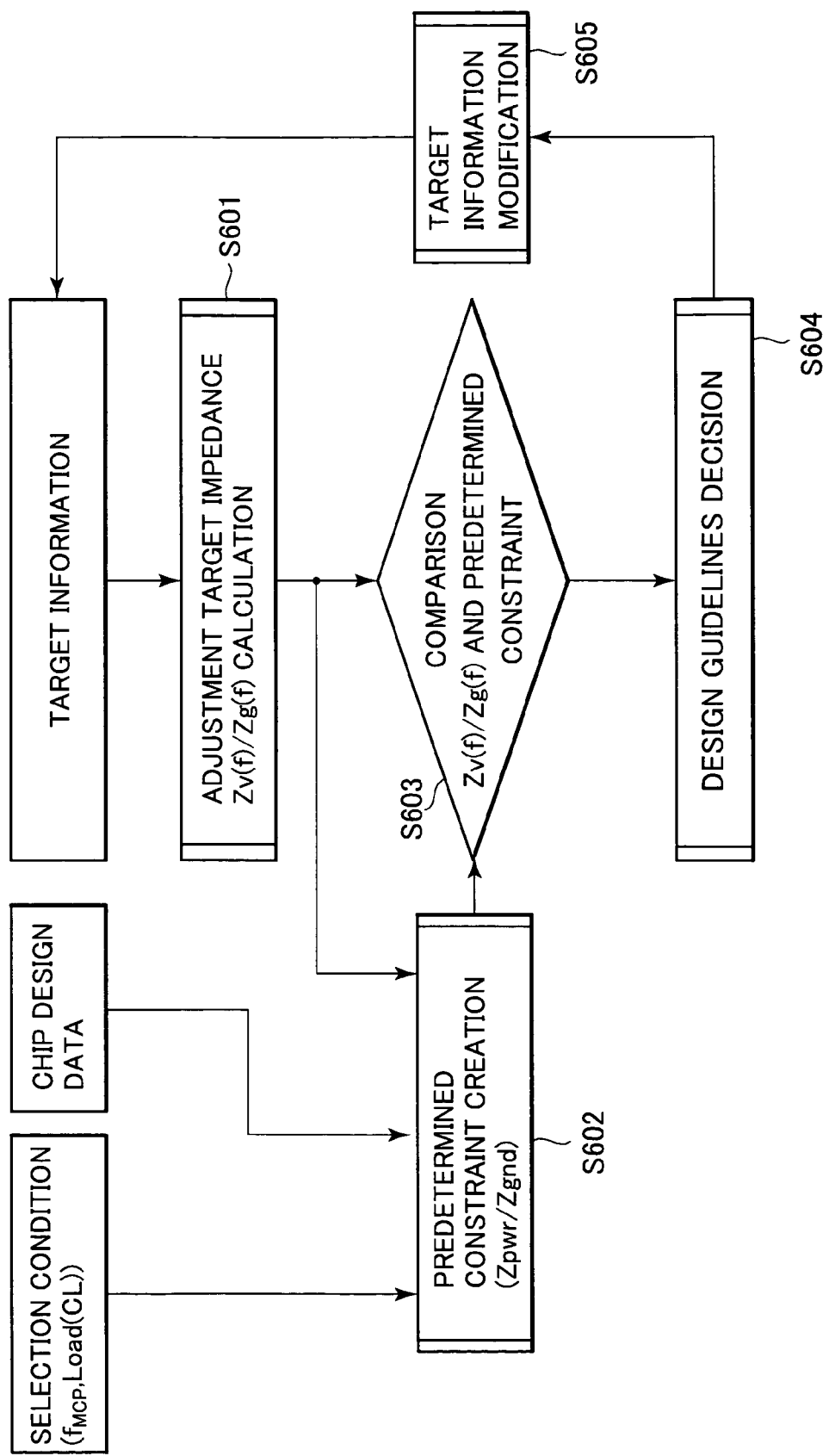
FIG. 12 is a flowchart showing a design method in accordance with a sixth embodiment of the present invention.

Next explanation will be made about a design method according to a sixth embodiment of the present invention, with reference to FIGS. 12 and 13. The design method of the sixth embodiment is a modification of the design method of the fifth embodiment. The sixth embodiment is different from the fifth embodiment in Step S602 of FIG. 12. Steps S601, S603 to S605 of FIG. 12 are same as Steps S501, S503 to S505 of FIG. 11. Hereinafter, only the difference will be described.

In Step S602, a predetermined constraint according to the present embodiment is not prepared in advance but is created in consideration of design data of the DRAM chip 40, impedances of the adjustment target and selection conditions such as operational frequency of the multi-chip package 30 and a load thereof. Step S602 of FIG. 12 is illustrated in FIG. 13 in detail.

Figure 13:
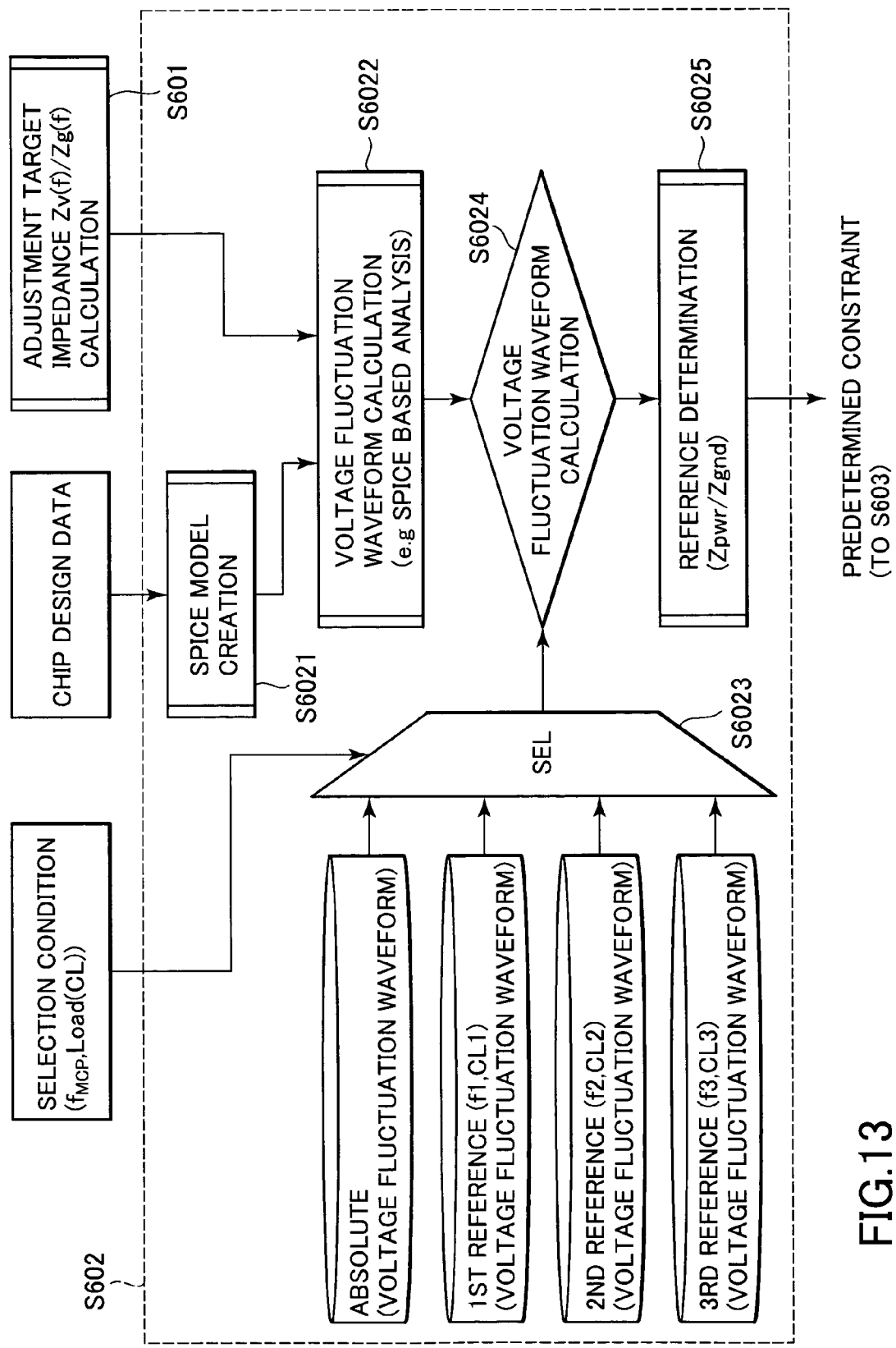
FIG. 13 is a flowchart showing a predetermined constraint creation process that is included in the design method of FIG. 12.

With reference to FIG. 13, a SPICE model is created from the design data of the DRAM chip 40 (Step S6021). Then, a first waveform is calculated from the created SPICE model and the impedances Zv(f)/Zg(f) of the adjustment target (Step S6022), wherein the first waveform is a waveform of voltage fluctuation between the power supply pad 41 and the ground pad 42 of the DRAM chip 40 and is obtained by a transient analysis such as a SPICE simulation. On the other hand, a plurality of references including "ABSOLUTE" are prepared in advance on the basis of the already-validated semiconductor apparatus (package) in consideration of various operation conditions, wherein "ABSOLUTE" is a special reference which does not relate to operational conditions and is selected when a selected condition clearly indicates the special reference. For example, "ABSOLUTE" may be 10% or less of the power supply level of the power supply unit 10. One of the prepared references is selected as a second waveform in accordance with the selection conditions (Step S6023). The second waveform is compared with the first waveform (Step S6024). Based on the comparison, at least one of suitable impedances Zpwr, Zgnd is determined as a predetermined constraint, which is used in the comparison process of Step S603 of FIG. 12.

Figure 14:
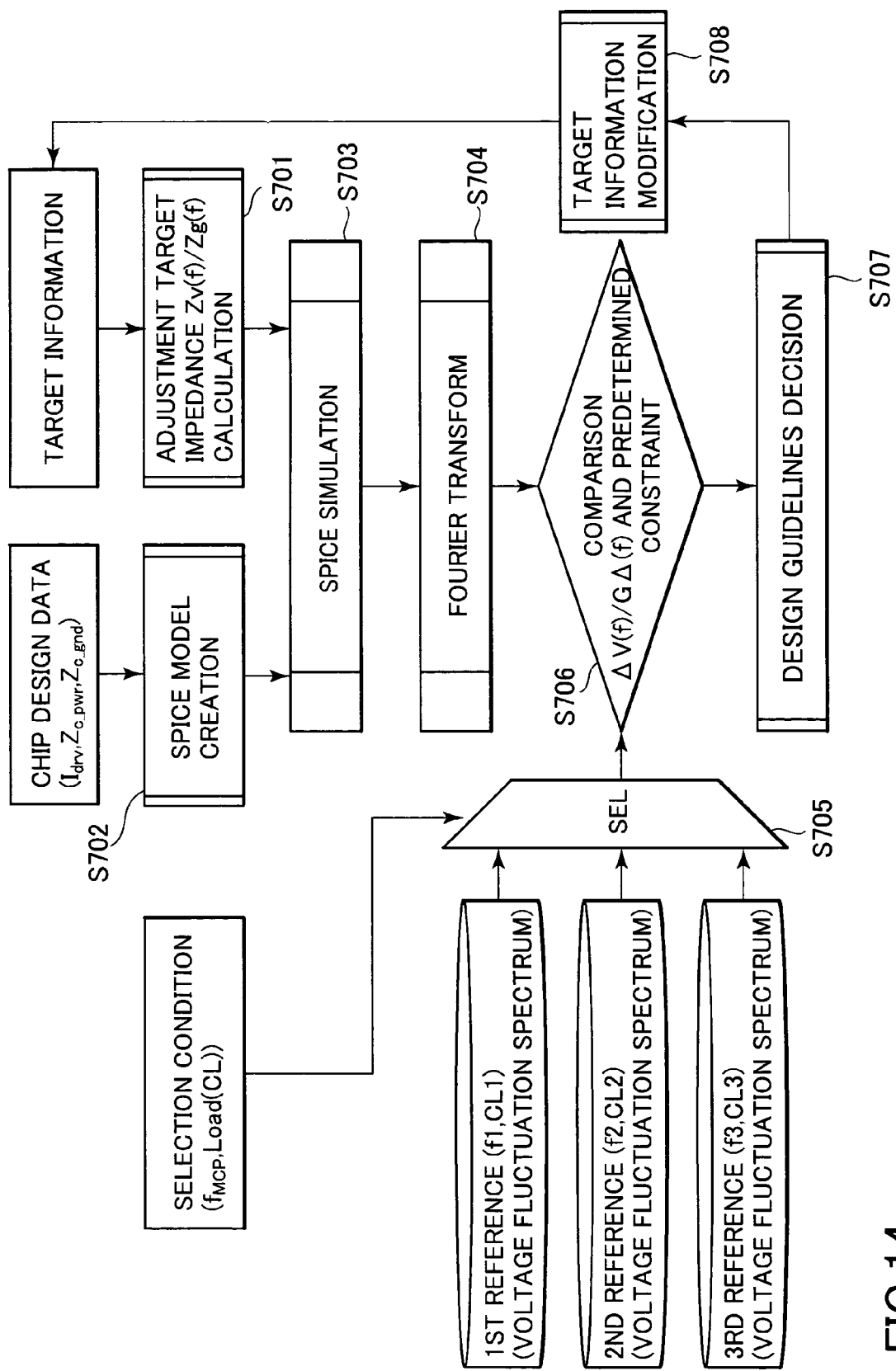
FIG. 14 is a flowchart showing a design method in accordance with a seventh embodiment of the present invention.

Next explanation will be made about a design method according to a seventh embodiment of the present invention, with reference to FIG. 14. The design method of the seventh embodiment is a modification of the design method of the second embodiment. The seventh embodiment is different from the second embodiment in that a transient analysis is used in part for the calculation process of the target variables. Steps S701, S705 to S708 of FIG. 14 are same as Steps S201, S203 to S206 of FIG. 8. Hereinafter, only the difference will be described.

With reference to FIG. 14, a SPICE model is created from the design data of the DRAM chip 40 (Step S702). Next, on the basis of the created SPICE model and the assumed impedance model created in Step S701, a SPICE simulation is carried out (Step S703). Since the SPICE simulation is a transient analysis, its result is represented not in frequency domain but in time domain. Therefore, Fourier transform process is carried out for the result of the SPICE simulation to obtain the target variables represented in frequency domain, i.e. voltage fluctuation spectrums in frequency domain representation.

The methods according to the above-described embodiments may be embodied, at least in part, as hardware logic in a circuit.

Alternatively, the above-described methods may be embodied, at least in part, as a software computer program product for use with a computer system. Such an implementation may comprise a series of computer readable instructions either fixed on a tangible medium, such as a computer readable medium, e.g., diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, e.g., shrink wrapped software, pre-loaded with a computer system, e.g., on a system ROM or fixed disk, or distributed from a server or electronic bulletin board over a network, e.g., the Internet or World Wide Web.

Figure 15:
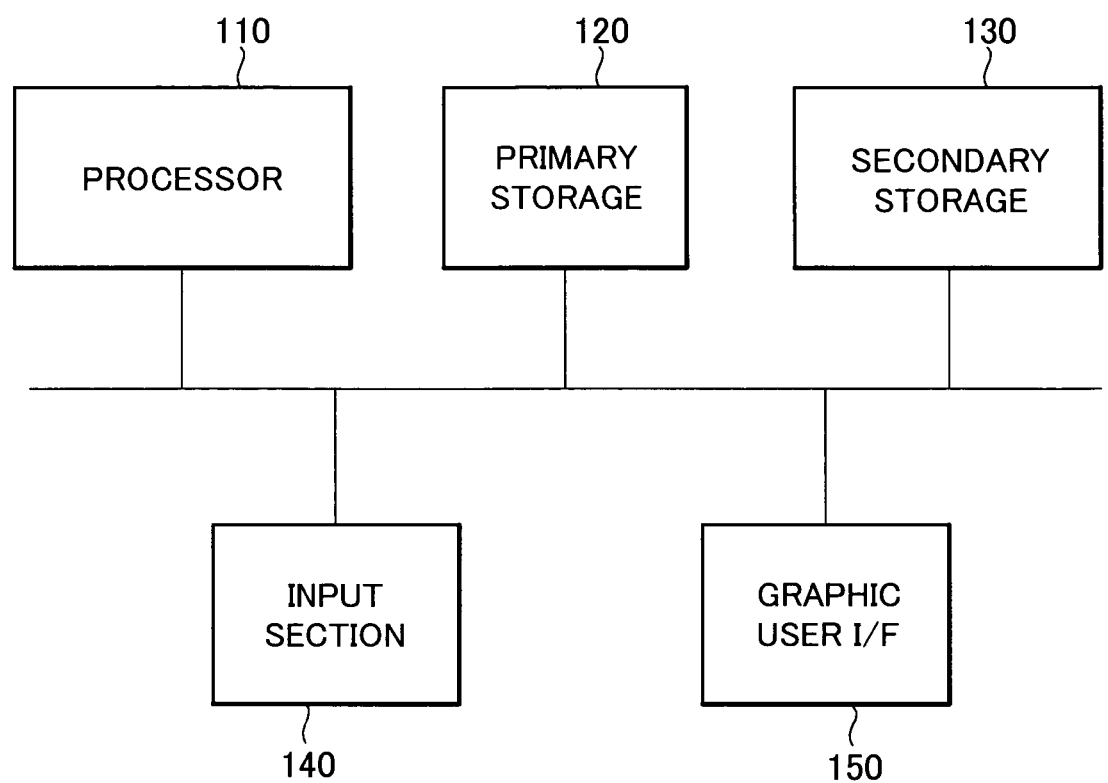
FIG. 15 is a block diagram showing a design aid system based on a method of an embodiment of the present invention.

With reference to FIG. 15, a system comprises a processor 110, a primary storage 120, a secondary storage 130, an input section 140 and a graphic user interface 150. The system may comprise various kinds of other computer components. The graphic user interface 150 is for example a display unit such as a cathode ray tube (CRT) display device, or a liquid crystal display (LCD) device. The secondary storage 130 is a hard disk drive in this embodiment and stores a computer program of the present embodiment. The primary storage 120 is a DRAM memory device in this embodiment. The computer program is loaded on the primary storage 120 and is executed by the processor 110 to cause the system to perform as a design aid system in accordance with one of the above-described methods. The primary storage serves as a temporal storage where the processor 110 stores temporal data during executing of the computer program. Taking a general-purpose computer system into consideration, the primary storage 120 and the secondary storage 130 are separated. However, the present invention is not limited thereto. The system may comprises a single storage instead of the primary storage 120 and the secondary storage 130.

In the design aid system as the implementation of the above-described method, the design guidelines may be shown by the graphic user interface 150.

Figure 16:
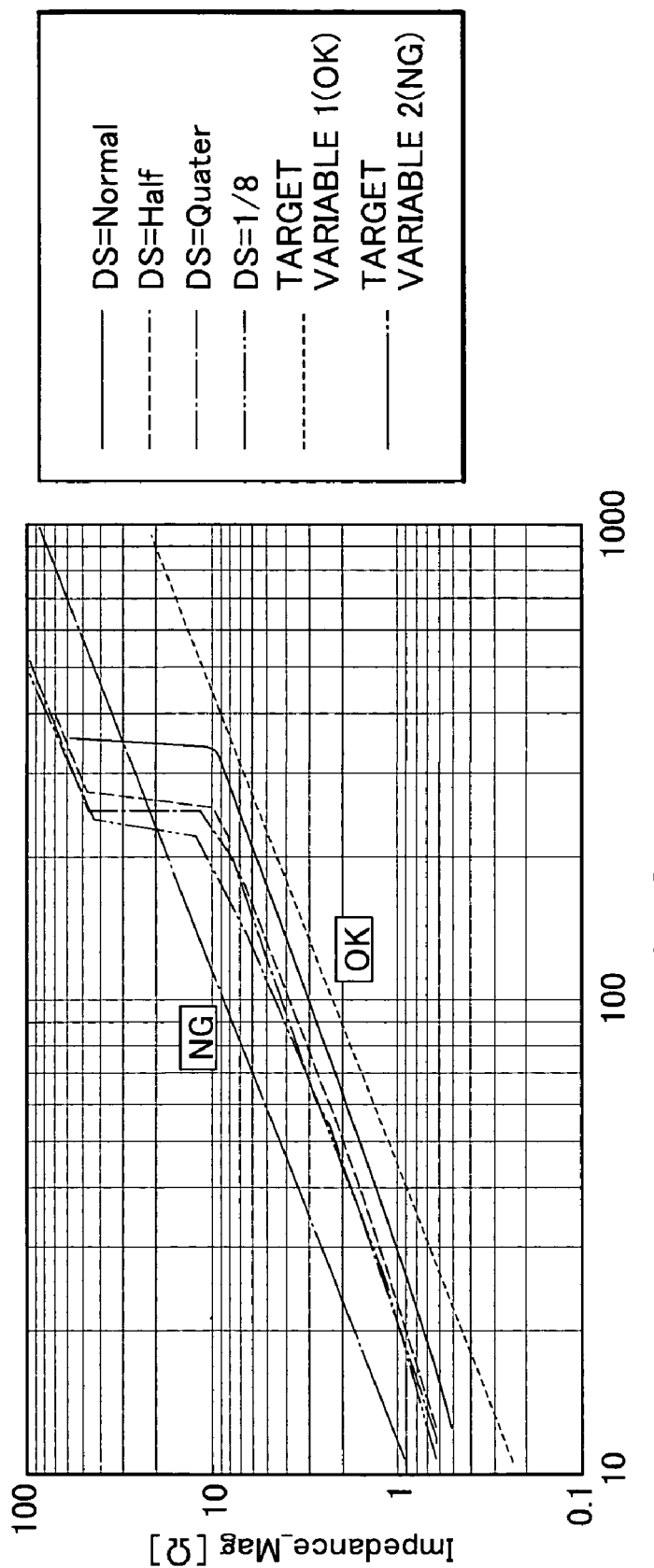
FIG. 16 is a view showing an example displayed as design guidelines on the graphic user interface of the design aid system of FIG. 15.

In addition, if a series of the above-described steps to decide the design guidelines is repeatedly carried out for various drive strengths (DS), a user may be provided with a set of the design guidelines associated with the drive strengths by the graphic user interface 150 as shown in FIG. 16, so that the user can compare the design guidelines of the plurality of drive strengths simultaneously. Furthermore, on the same view, a target variable may be shown. If there is shown a target variable together with the design guidelines of the drive strengths, the user can easily judge whether the target variable is "OK" or "NG". The judgment may be automated in accordance with the computer program.

In the above-described embodiments, the explanations were made about a single pair of the electrical paths, i.e. a pair of the power-supply-related electrical path and the ground-related electrical path. In practice, there are however often two or more power supply pads, thereby, two or more power-supply related electrical paths.

Figure 17:
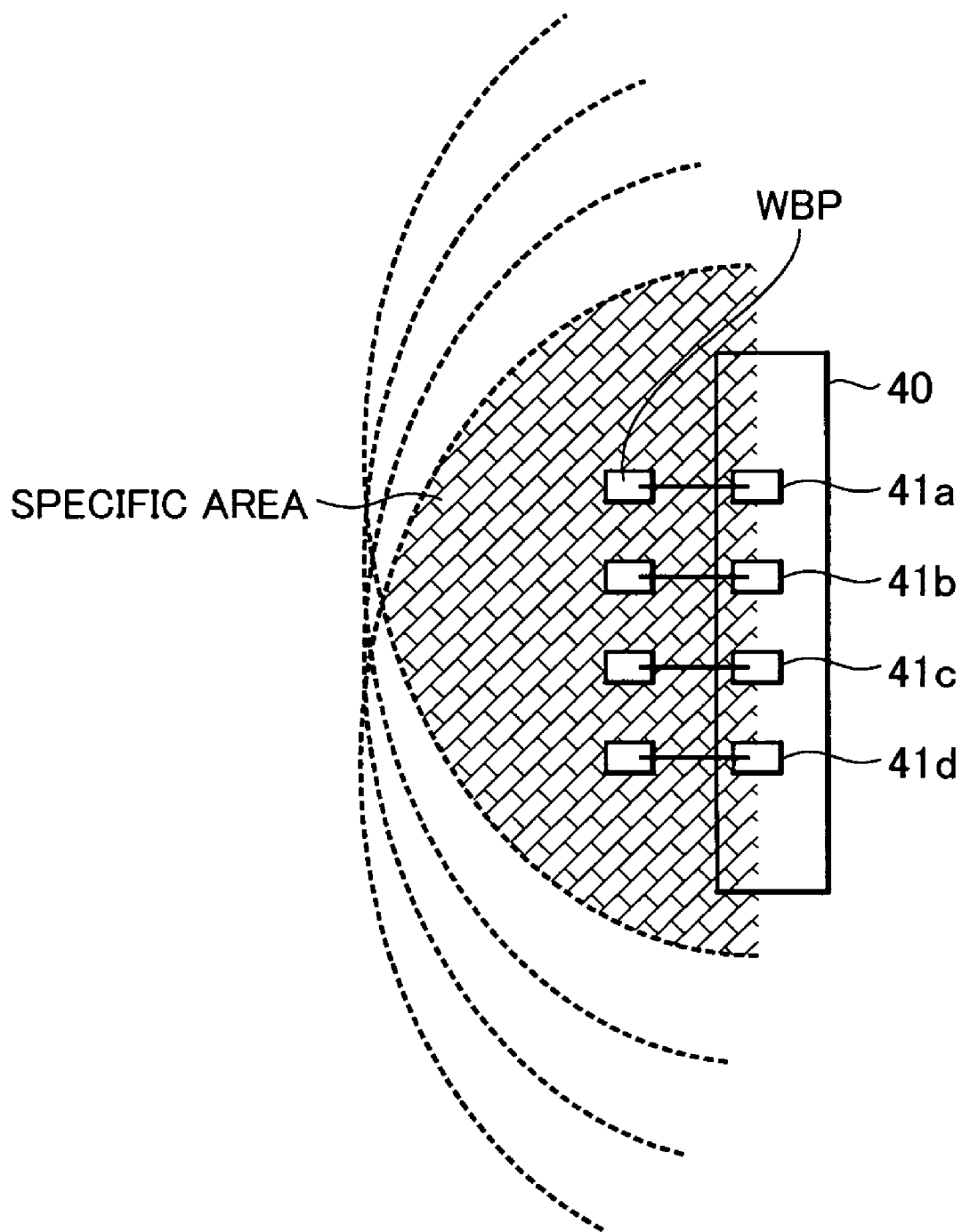
FIG. 17 is a view showing another example displayed as design guidelines on the graphic user interface of the design aid system of FIG. 15.

As shown in FIG. 17, there are four power supply pads 41*a* to 41*d*; "WBP" in FIG. 17 shows a wire bonding pad. In this case, the design guidelines may be decided for each power supply pad 41*a*, 41*b*, 41*c*, 41*d*. In FIG. 17, there are four partial circles shown with dotted lines, which are design guidelines for the power supply pads 41*a* to 41*d*, respectively. The partial circles may be partial squares, respectively. Alternatively, the design guidelines are shown with Manhattan distances, respectively.

The design guidelines for the power supply pads 41*a* to 41*d* may be shown simultaneously as shown in FIG. 17. In this event, there might be seen a specific area on which the design guidelines overlap with each other. As apparent from FIG. 17, the specific area meets all of the design guidelines so that a common power supply terminal for the power supply pads 41*a* to 41*d* can be arranged on the specific area. Outside of the specific area, there is another area on which a common power supply terminal for two or three of the power supply pads 41*a* to 41*d*; the area may be provided with a unique color-code dependent on the number of correspondable power supply pads.

Figure 18:
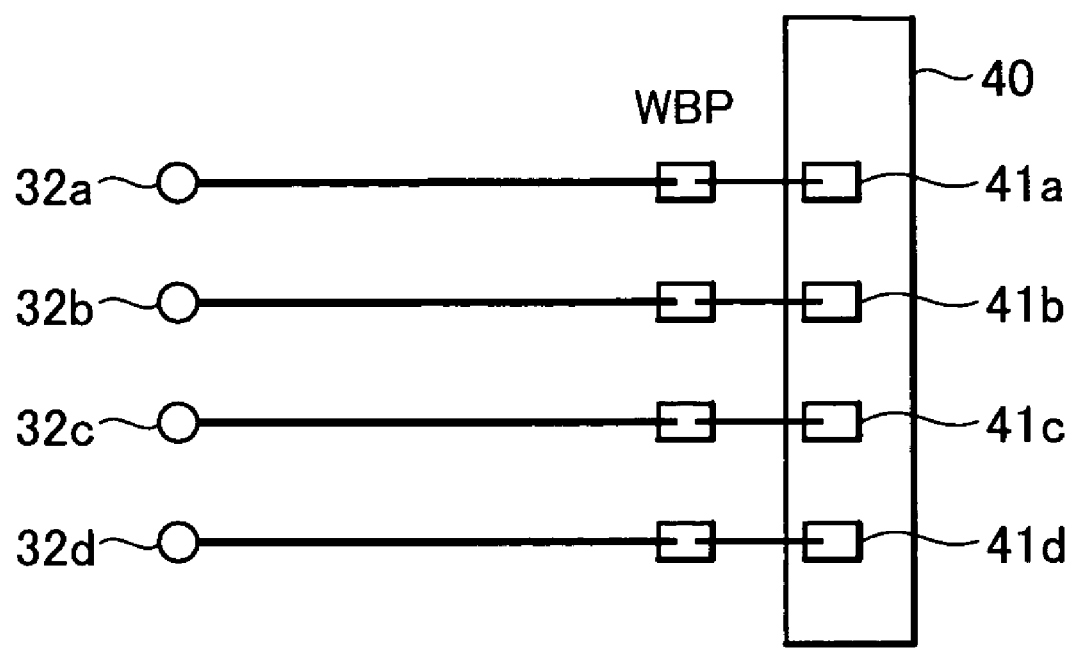
FIG. 18 is a view for use in describing a semiconductor package which is designed in accordance with a design method of an embodiment of the present invention.

A semiconductor package manufactured in accordance with the above-explained method has a feature that, if the power supply terminals are M (M is natural number more than one) and if the power supply pads are also M and if the electrical paths connecting the terminals and the pads are also M, each of the electrical paths has an impedance of M times or less of the optimized impedance of the design guidelines. For example, M is four in the example shown in FIG. 18; each of the electrical paths between the pads 41*a* to 41*d* and the terminals 32*a* to 32*d* has an impedance of four times or less of the optimized impedance. In addition, if the target information relates to a width of the trace and if the traces included in the electrical paths have a common shape, each of the traces has a length of M times or less of the maximized length of the design guidelines.

Figure 19:
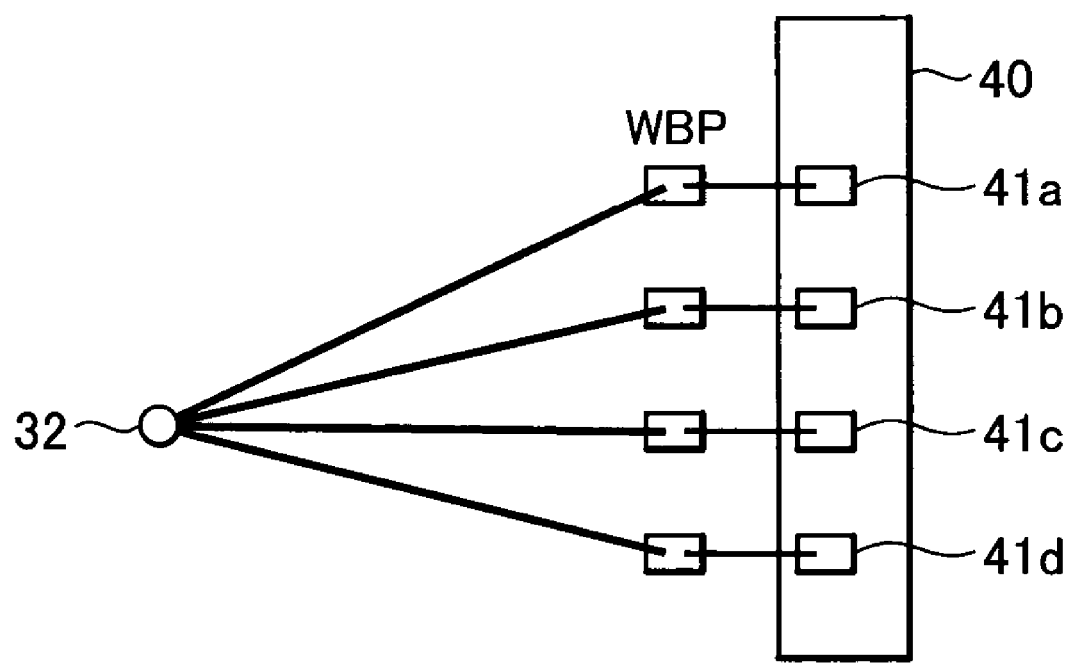
FIG. 19 is another view for use in describing a semiconductor package which is designed in accordance with a design method of an embodiment of the present invention.

Another semiconductor package manufactured in accordance with the above-explained method has a feature that, if there are N of the power supply terminals (N is natural number more than one) and if P of the power supply pads are connected to a single terminal (P is natural number; P=1~N) so that there are P of the electrical paths for the single terminal, the largest impedance of one of the electrical paths is equal to or less than Q (=N×P) times of the optimized impedance of the design guidelines. For example, N is one and P is four in the example shown in FIG. 19; the largest impedance of the electrical path between the terminal 32 and the pads 41*a*, 41*b*, 41*c*, 41*d* has an impedance equal to or less than four-times of the optimized impedance. In addition, if the target information relates to a width of the trace, the longest trance has a length equal to or less than Q times of the maximized length of the design guidelines.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

This application is based on Japanese Patent Application filed on Aug. 29, 2005, No. JP2005-247935, and those claims, specification and drawings are incorporated herein by reference.

What is claimed is:

1. A computer-implemented method for improving a design for a semiconductor apparatus comprising a semiconductor package in consideration of power integrity for a semiconductor chip included in the semiconductor package, the semiconductor chip comprising a power supply pad and a ground pad, the semiconductor package comprising, in addition to the semiconductor chip, a power supply terminal, a ground terminal and electrical paths electrically connecting between the power supply pad and the power supply terminal and between the ground pad and the ground terminal, respectively, the method comprising:

receiving design data, the design data including specifications for an adjustment target;

calculating a target variable for the adjustment target on the basis of target information about the adjustment target, the target variable being represented in frequency domain, the adjustment target comprising at least the electrical paths;

comparing the target variable with a predetermined constraint represented in frequency domain to identify a problematic section of the adjustment target corresponding to a frequency region at which the target variable exceeds the predetermined constraint; and deciding design guidelines, for use with the design data, to solve the identified problematic section of the adjustment target, wherein the above steps are performed by one or more computers programmed to perform the above steps.

2. The method according to claim 1, wherein the calculating is carried out by using an assumed impedance model which is assumed by representing the adjustment target as a combination of two or more passive circuit blocks.

3. The method according to claim 1, wherein:

the target variable is an impedance variable represented in frequency domain;

the adjustment target section is at least one of the electrical paths; and the predetermined constraint is an impedance of a model electrical path which is included in an already-validated semiconductor apparatus and corresponds to the at least one electrical path.

4. The method according to claim 3, wherein the predetermined constraint is an impedance variable which is represented in frequency domain and is calculated from an impedance model for the already-validated semiconductor apparatus.

5. The method according to claim 3, the already-validated semiconductor apparatus comprising a validated semiconductor chip having a power supply pad and a ground pad, wherein the predetermined constraint is an impedance which is obtained by a comparison between a first waveform and a second waveform, the first waveform being a waveform based on a transient analysis on voltage fluctuation between the power supply pad and the ground pad of the semiconductor chip, the second waveform being a waveform of voltage fluctuation between the power supply pad and the ground pad of the validated semiconductor chip.

6. The method according to claim 2, wherein the calculating is carried out by using a combination of a chip model and the assumed impedance model connected thereto, the chip model being an equivalent circuit model represented in frequency domain, as seen from the power supply pad and the ground pad inside of the semiconductor chip.

7. The method according to claim 6, the semiconductor chip having a frequency-dependent impedance between the power supply pad and the ground pad, wherein the chip model is obtainable by connecting an assumed impedance element and a current source in parallel with each other between the power supply pad and the ground pad, the assumed impedance element having the frequency-dependent impedance, the current source providing a frequency-dependent current.

8. The method according to claim 7, wherein the frequency-dependent current is a maximum current which is expected to flow at the power supply pad and the ground pad upon an actual use of the semiconductor chip.

9. The method according to claim 6, the semiconductor chip having a frequency-dependent impedance between the power supply pad and the ground pad, wherein the chip model is obtainable by connecting an assumed impedance element and a voltage source in series between the power supply pad and the ground pad, the assumed impedance element having the frequency-dependent impedance, the voltage source providing a frequency-dependent voltage.

10. The method according to claim 9, wherein the frequency-dependent voltage is a product of the frequency-dependent impedance and a maximum current which is expected to flow at the power supply pad and the ground pad upon an actual use of the semiconductor chip.

11. The method according to claim 6, the semiconductor apparatus comprising a printed-circuit board on which the semiconductor package is mounted, the printed-circuit board comprising electrical components, the adjustment target including the electrical components of the printed-circuit board in addition to the electrical paths, the method further comprising creating the chip model on the basis of the target information and design data of the semiconductor chip and on the assumption that the electrical components of the printed-circuit board have a total impedance equal to zero.

12. The method according to claim 6, wherein the target variable is a set of voltage fluctuation spectrums which are, in frequency domain representation, voltage fluctuations at the power supply pad and the ground pad, respectively.

13. The method according to claim 6, wherein the target variable is a voltage fluctuation spectrum which is, in frequency domain representation, a voltage fluctuation at the power supply pad.

14. The method according to claim 6, wherein the predetermined constraint is a voltage fluctuation spectrum which is calculated from design data of an already-validated semiconductor apparatus.

15. The method according to claim 6, wherein the predetermined constraint is a voltage fluctuation spectrum which is obtained by actually measuring an already-validated semiconductor apparatus.

16. The method according to claim 6, the semiconductor chip operating at a predetermined voltage level as its power supply level, wherein the predetermined constraint is selected to be 10% or less of the predetermined voltage level.

17. The method according to claim 1, wherein the calculating comprises:

creating a SPICE model based on design data of the semiconductor chip;

computing an impedance of the adjustment target on the basis of the target information;

carrying out a SPICE simulation based on the created SPICE model and the computed impedance to produce an analysis result; and performing a Fourier transform process for the produced analysis result to obtain the target variable in frequency domain representation.

18. The method according to claim 1, further comprising:
preparing a plurality of references; and
selecting one of the prepared references as the predetermined constraint.

19. The method according to claim 1, wherein the design guidelines comprises at least one of:
an optimized impedance of at least one of the electrical paths;
an optimized width, length and/or thickness of at least one trace of a pattern or a wire included in at least one of the electrical paths;
a result of pass/fail determination for at least one trace of a pattern or at least one wire included in at least one of the electrical paths;
an optimized electrical length of at least one of the electrical paths;
an optimized number of layers constituting a package substrate which is included in the semiconductor package and on which the semiconductor chip is mounted;
a minimized width of at least one trace of a pattern included in at least one of the electrical paths if the target information relates to a length of the trace; and
a maximized length of at least one trace of a pattern included in at least one of the electrical paths if the target information relates to a width of the trace.

20. A semiconductor package manufactured in accordance with the method claimed in claim 19, the design guidelines comprising the optimized impedance, the semiconductor package comprising a predetermined number of package terminals as the power supply terminal/ground terminal, a predetermined number of chip pads as the power supply pad/ground pad and a predetermined number of electrical connection sections as the electrical paths, wherein: the predetermined number of electrical connection sections have a common shape and a common size to each other; and each of the predetermined number of electrical connection sections has an impedance equal to or less than the predetermined number times of the optimized impedance.

21. A semiconductor package manufactured in accordance with the method claimed in claim 19, the design guidelines comprising the maximized length, the semiconductor package comprising a predetermined number of terminals as the power supply terminal/ground terminal, a plurality of chip pads as the power supply pad/ground pad and a plurality of traces as the electrical paths, wherein:
the traces are same in number as the chip pads and are connected to the chip pads, respectively;
each of the package terminals is connected one or more of the traces; and
in a case where a first number of the traces are connected to one of the package terminals and where a second number is a product of the first number and the predetermined number, a longest one among the first number of the traces has a length equal to or less than the second number times of the maximized length.

22. A system for aiding to design a semiconductor apparatus comprising a semiconductor package in consideration of power integrity for a semiconductor chip included in the semiconductor package, the semiconductor chip comprising a power supply pad and a ground pad, the semiconductor package comprising, in addition to the semiconductor chip, a power supply terminal, a ground terminal and electrical paths electrically connecting between the power supply pad and the power supply terminal and between the ground pad and the ground terminal, respectively, the system comprising:
an input section configured to input, into the system, target information about an adjustment target which comprises at least the electrical paths;
a calculator configured to calculate a target variable for the adjustment target on the basis of the target information, the target variable being represented in frequency domain;
a provider configured to provide a predetermined constraint represented in frequency domain;
a comparator configured to compare the target variable with the predetermined constraint in frequency domain to identify a problematic section of the adjustment target corresponding to a frequency region at which the target variable exceeds the predetermined constraint; and
a decider configured to decide design guidelines to solve the identified problematic section of the adjustment target.

23. The system according to claim 22, wherein the calculator is configured to carry out the calculation by using an assumed impedance model which is assumed by representing the adjustment target as a combination of two or more passive circuit blocks.

24. The system according to claim 22, further comprising a graphic user interface configured to show the design guidelines to a user.

25. A system comprising a bus system, a processor connected to the bus system and a memory connected to the bus system, the memory storing a computer program that, when executed by the processor, causes the processor to perform predetermined operations to aid to design a semiconductor apparatus comprising a semiconductor package in consideration of power integrity for a semiconductor chip included in the semiconductor package, the semiconductor chip comprising a power supply pad and a ground pad, the semiconductor package comprising, in addition to the semiconductor chip, a power supply terminal, a ground terminal and electrical paths electrically connecting between the power supply pad and the power supply terminal and between the ground pad and the ground terminal, respectively, the predetermined operations comprising:
calculating a target variable for an adjustment target on the basis of target information about the adjustment target, the target variable being represented in frequency domain, the adjustment target comprising at least the electrical paths;
comparing the target variable with a predetermined constraint represented in frequency domain to identify a problematic section of the adjustment target corresponding to a frequency region at which the target variable exceeds the predetermined constraint; and
deciding design guidelines to solve the identified problematic section of the adjustment target.

26. The system according to claim 25, wherein the calculating is carried out by using an assumed impedance model which is assumed by representing the adjustment target as a combination of two or more passive circuit blocks.

27. The system according to claim 25, wherein:
the target variable is an impedance variable represented in frequency domain;
the adjustment target is at least one of the electrical paths; and the predetermined constraint is an impedance of a model electrical path which is included in an already-validated semiconductor apparatus and corresponds to the at least one electrical path.

28. The system according to claim 27, wherein the predetermined constraint is an impedance variable which is represented in frequency domain and is calculated from an impedance model for the already-validated semiconductor apparatus.

29. The system according to claim 27, the already-validated semiconductor apparatus comprising a validated semiconductor chip having a power supply pad and a ground pad, wherein the predetermined constraint is an impedance which is obtained by a comparison between a first waveform and a second waveform, the first waveform being a waveform based on a transient analysis on voltage fluctuation between the power supply pad and the ground pad of the semiconductor chip, the second waveform being a waveform of voltage fluctuation between the power supply pad and the ground pad of the validated semiconductor chip.

30. The system according to claim 26, wherein the calculating is carried out by using a combination of a chip model and the assumed impedance model connected thereto, the chip model being an equivalent circuit model represented in frequency domain, as seen from the power supply pad and the ground pad inside of the semiconductor chip.

31. The system according to claim 30, the semiconductor chip having a frequency-dependent impedance between the power supply pad and the ground pad, wherein the chip model is obtainable by connecting an assumed impedance element and a current source in parallel with each other between the power supply pad and the ground pad, the assumed impedance element having the frequency-dependent impedance, the current source providing a frequency-dependent current.

32. The system according to claim 31, wherein the frequency-dependent current is a maximum current which is expected to flow at the power supply pad and the ground pad upon an actual use of the semiconductor chip.

33. The system according to claim 30, the semiconductor chip having a frequency-dependent impedance between the power supply pad and the ground pad, wherein the chip model is obtainable by connecting an assumed impedance element and a voltage source in series between the power supply pad and the ground pad, the assumed impedance element having the frequency-dependent impedance, the voltage source providing a frequency-dependent voltage.

34. The system according to claim 33, wherein the frequency-dependent voltage is a product of the frequency-dependent impedance and a maximum current which is expected to flow at the power supply pad and the ground pad upon an actual use of the semiconductor chip.

35. The system according to claim 30, the semiconductor apparatus comprising a printed-circuit board on which the semiconductor package is mounted, the printed-circuit board comprising electrical components, the adjustment target including the electrical components of the printed-circuit board in addition to the electrical paths, the method further comprising creating the chip model on the basis of the target information and design data of the semiconductor chip and on the assumption that the electrical components of the printed-circuit board have a total impedance equal to zero.

36. The system according to claim 30, wherein the target variable is a set of voltage fluctuation spectrums which are, in frequency domain representation, voltage fluctuations at the power supply pad and the ground pad, respectively.

37. The system according to claim 30, wherein the target variable is a voltage fluctuation spectrum which is in frequency domain representation, a voltage fluctuation at the power supply pad.

38. The system according to claim 30, wherein the predetermined constraint is a voltage fluctuation spectrum which is calculated from design data of an already-validated semiconductor apparatus.

39. The system according to claim 30, wherein the predetermined constraint is a voltage fluctuation spectrum which is obtained by actually measuring an already-validated semiconductor apparatus.

40. The system according to claim 30, the semiconductor chip operating at a predetermined voltage level as its power supply level, wherein the predetermined constraint is selected to be 10% or less of the predetermined voltage level.

41. The system according to claim 25, wherein the calculating comprises:
creating a SPICE model based on design data of the semiconductor chip;
computing an impedance of the adjustment target on the basis of the target information;
carrying out a SPICE simulation based on the created SPICE model and the computed impedance to produce an analysis result; and
performing a Fourier transform process for the produced analysis result to obtain the target variable in frequency domain representation.

42. The system according to claim 25, wherein:
the memory stores a plurality of references; and
the predetermined operations further comprises selecting one of the prepared references as the predetermined constraint.

43. The system according to claim 25, wherein the design guidelines comprises at least one of:
an optimized impedance of at least one of the electrical paths;
an optimized width, length and/or thickness of at least one trace of a pattern or a wire included in at least one of the electrical paths;
a result of pass/fail determination for at least one trace of a pattern or at least one wire included in at least one of the electrical paths;
an optimized electrical length of at least one of the electrical paths;
an optimized number of layers constituting a package substrate which is included in the semiconductor package and on which the semiconductor chip is mounted;
a minimized width of at least one trace of a pattern included in at least one of the electrical paths if the target information relates to a length of the trace; and
a maximized length of at least one trace of a pattern included in at least one of the electrical paths if the target information relates to a width of the trace.

44. The system according to claim 25, further comprising a graphic user interface configured to show the design guidelines to a user.

45. The system according to claim 44, wherein the predetermined operations further comprises showing, when the deciding are carried out for a plurality of drive strengths, a set of the design guidelines associated with the drive strengths so as to allow the user to compare them.

46. A computer readable storage medium comprising instructions which when executed by a computer for aiding to design a semiconductor apparatus comprising a semiconductor package in consideration of power integrity for a semiconductor chip included in the semiconductor package, the semiconductor chip comprising a power supply pad and a ground pad, the semiconductor package comprising, in addition to the semiconductor chip, a power supply terminal, a ground terminal and electrical paths electrically connecting between the power supply pad and the power supply terminal and between the ground pad and the ground terminal, respectively, the instructions cause the computer to perform a method comprising:

calculating a target variable for an adjustment target on the basis of target information about the adjustment target, the target variable being represented in frequency domain, the adjustment target comprising at least the electrical paths;

comparing the target variable with a predetermined constraint represented in frequency domain to identify a problematic section of the adjustment target corresponding to a frequency region at which the target variable exceeds the predetermined constraint; and deciding design guidelines to solve the identified problematic section of the adjustment target.

47. The computer readable storage medium according to claim 46, wherein the calculating is carried out by using an assumed impedance model which is assumed by representing the adjustment target as a combination of two or more passive circuit blocks.

48. The computer readable storage medium according to claim 46, wherein:

the target variable is an impedance variable represented in frequency domain;

the adjustment target is at least one of the electrical paths; and the predetermined constraint is an impedance of a model electrical path which is included in an already-validated semiconductor apparatus and corresponds to the at least one electrical path.

49. The computer readable storage medium according to claim 48, wherein the predetermined constraint is an impedance variable which is represented in frequency domain and is calculated from an impedance model for the already-validated semiconductor apparatus.

50. The computer readable storage medium according to claim 48, the already-validated semiconductor apparatus comprising a validated semiconductor chip having a power supply pad and a ground pad, wherein the predetermined constraint is an impedance which is obtained by a comparison between a first waveform and a second waveform, the first waveform being a waveform based on a transient analysis on voltage fluctuation between the power supply pad and the ground pad of the semiconductor chip, the second waveform being a waveform of voltage fluctuation between the power supply pad and the ground pad of the validated semiconductor chip.

51. The computer readable storage medium according to claim 47, wherein the instructions for calculating is carried out by using a combination of a chip model and the assumed impedance model connected thereto, the chip model being an equivalent circuit model represented in frequency domain, as seen from the power supply pad and the ground pad inside of the semiconductor chip.

52. The computer readable storage medium according to claim 51, the semiconductor chip having a frequency-dependent impedance between the power supply pad and the ground pad, wherein the chip model is obtainable by connecting an assumed impedance element and a current source in parallel with each other between the power supply pad and the ground pad, the assumed impedance element having the frequency-dependent impedance, the current source providing a frequency-dependent current.

53. The computer readable storage medium according to claim 52, wherein the frequency-dependent current is a maximum current which is expected to flow at the power supply pad and the ground pad upon an actual use of the semiconductor chip.

54. The computer readable storage medium according to claim 51, the semiconductor chip having a frequency-dependent impedance between the power supply pad and the ground pad, wherein the chip model is obtainable by connecting an assumed impedance element and a voltage source in series between the power supply pad and the ground pad, the assumed impedance element having the frequency-dependent impedance, the voltage source providing a frequency-dependent voltage.

55. The computer readable storage medium according to claim 54, wherein the frequency-dependent voltage is a product of the frequency-dependent impedance and a maximum current which is expected to flow at the power supply pad and the ground pad upon an actual use of the semiconductor chip.

56. The computer readable storage medium according to claim 51, the semiconductor apparatus comprising a printed-circuit board on which the semiconductor package is mounted, the printed-circuit board comprising electrical components, the adjustment target including the electrical components of the printed-circuit board in addition to the electrical paths, and the method further comprising creating the chip model on the basis of the target information and design data of the semiconductor chip and on the assumption that the electrical components of the printed-circuit board have a total impedance equal to zero.

57. The computer readable storage medium according to claim 51, wherein the target variable is a set of voltage fluctuation spectrums which are, in frequency domain representation, voltage fluctuations at the power supply pad and the ground pad, respectively.

58. The computer readable storage medium according to claim 51, wherein the target variable is a voltage fluctuation spectrum which is, in frequency domain representation, a voltage fluctuation at the power supply pad.

59. The computer readable storage medium according to claim 51, wherein the predetermined constraint is a voltage fluctuation spectrum which is calculated from design data of an already-validated semiconductor apparatus.

60. The computer readable storage medium according to claim 51, wherein the predetermined constraint is a voltage fluctuation spectrum which is obtained by actually measuring an already-validated semiconductor apparatus.

61. The computer readable storage medium according to claim 51, the semiconductor chip operating at a predetermined voltage level as its power supply level, wherein the predetermined constraint is selected to be 10 % or less of the predetermined voltage level.

62. The computer readable storage medium according to claim 46, the method further comprising:

creating a SPICE model based on design data of the semiconductor chip;

computing an impedance of the adjustment target on the basis of the target information;

carrying out a SPICE simulation based on the created SPICE model and the computed impedance to produce an analysis result; and performing a Fourier transform process for the produced analysis result to obtain the target variable in frequency domain representation.

63. The computer readable storage medium according to claim 46, the method further comprising selecting one of a plurality of references, the references stored in a memory, as the predetermined constraint.

64. The computer readable storage medium according to claim 46, wherein the design guidelines comprises at least one of:
- an optimized impedance of at least one of the electrical paths;
- an optimized width, length and/or thickness of at least one trace of a pattern or a wire included in at least one of the electrical paths;
- a result of pass/fail determination for at least one trace of a pattern or at least one wire included in at least one of the electrical paths;
- an optimized electrical length of at least one of the electrical paths;
- an optimized number of layers constituting a package substrate which is included in the semiconductor package and on which the semiconductor chip is mounted;
- a minimized width of at least one trace of a pattern included in at least one of the electrical paths if the target information relates to a length of the trace; and
- a maximized length of at least one trace of a pattern included in at least one of the electrical paths if the target information relates to a width of the trace.

65. The computer readable storage medium according to claim 46, the method further comprising showing via a graphic user interface to a user, when the deciding is carried out for a plurality of drive strengths, a set of the design guidelines associated with the drive strengths so as to allow the user to compare them.

* * * * *